(12) United States Patent
Sakakibara et al.

(10) Patent No.: US 10,217,604 B2
(45) Date of Patent: Feb. 26, 2019

(54) CHARGED PARTICLE BEAM APPARATUS

(71) Applicant: HITACHI HIGH-TECHNOLOGIES CORPORATION, Minato-ku, Tokyo (JP)

(72) Inventors: Makoto Sakakibara, Tokyo (JP); Hajime Kawano, Tokyo (JP); Makoto Suzuki, Tokyo (JP); Yuji Kasai, Tokyo (JP); Daisuke Bizen, Tokyo (JP); Yoshinori Momonoi, Tokyo (JP)

(73) Assignee: HITACHI HIGH-TECHNOLOGIES CORPORATION, Tokyo (JP)

(*) Notice: Subject to any disclaimer, the term of this patent is extended or adjusted under 35 U.S.C. 154(b) by 0 days.

(21) Appl. No.: 15/527,073

(22) PCT Filed: Nov. 18, 2015

(86) PCT No.: PCT/JP2015/082388
§ 371 (c)(1),
(2) Date: May 16, 2017

(87) PCT Pub. No.: WO2016/084675
PCT Pub. Date: Jun. 2, 2016

(65) Prior Publication Data
US 2018/0286629 A1 Oct. 4, 2018

(30) Foreign Application Priority Data
Nov. 26, 2014 (JP) .................................. 2014-239011

(51) Int. Cl.
*H01J 37/21* (2006.01)
*H01J 37/147* (2006.01)
(Continued)

(52) U.S. Cl.
CPC ............ *H01J 37/21* (2013.01); *H01J 37/147* (2013.01); *H01J 37/22* (2013.01); *H01J 37/244* (2013.01);
(Continued)

(58) Field of Classification Search
CPC ........ H01J 37/21; H01J 37/147; H01J 37/244; H01J 37/28; H01J 2237/216; H01J 2237/2806
(Continued)

(56) References Cited

U.S. PATENT DOCUMENTS

| 6,426,501 | B1 * | 7/2002 | Nakagawa | .............. | H01J 37/28 250/252.1 |
| 2003/0218140 | A1 * | 11/2003 | Tamamori | .............. | B82Y 10/00 250/492.1 |

FOREIGN PATENT DOCUMENTS

JP    5-172910 A    7/1993

* cited by examiner

*Primary Examiner* — Nicole M Ippolito
(74) *Attorney, Agent, or Firm* — Miles & Stockbridge P.C.

(57) ABSTRACT

A charged particle beam device includes a charged particle source that generates a charged particle beam, a focus adjustment unit that adjusts a focal position of the charged particle beam, a deflection unit for scanning the charged particle beam on the sample, a detection unit that detects charged particles generated when the sample is irradiated with the charged particle beam, a detected charged particle selection unit that selects charged particles to be detected by the detection unit, and a control processing unit that makes focus adjustment of the focus adjustment unit and reference adjustment of the detected charged particle selection unit by using information from the detection unit acquired from one scan.

15 Claims, 19 Drawing Sheets

(51) Int. Cl.
*H01J 37/244* (2006.01)
*H01J 37/28* (2006.01)
*H01J 37/22* (2006.01)

(52) U.S. Cl.
CPC ......... *H01J 37/28* (2013.01); *H01J 2237/216* (2013.01); *H01J 2237/2806* (2013.01)

(58) Field of Classification Search
USPC ............. 250/306, 307, 309, 310, 311, 492.1, 250/492.2, 492.3
See application file for complete search history.

FIG. 4

SETTING OF ENERGY FILTER REFERENCE ADJUSTMENT

401 — ADJUSTMENT TIMING
- EACH MEASUREMENT POINT ■
- PERIODIC POINTS ☐
- INITIAL POINT ONLY ☐
- NONE ☐

PERIODIC NUMBER SETTING: EVERY FIVE TIMES

402 —
- COORDINATES: X 1000000   Y 1000000
- MAGNIFICATION: ×200k
- SCAN TYPE: TV
- NUMBER OF FRAMES: 1
- FILTER REFERENCE BRIGHTNESS: 50%

|  | ON | OFF |
|---|---|---|
| 403 — SIMULTANEOUS AUTOFOCUS CORRECTION | ● | ○ |
| 404 — AUTOMATIC INCORPORATION INTO DETECTOR GAIN | ☑ | |
| 405 — BRIGHTNESS CORRECTION MODE | ☑ | |
| 406 — ELECTRIFICATION AMOUNT MONITOR | ● | ○ |
| 407 — MAGNIFICATION FEEDBACK | ☑ | |
| 408 — DISPLACEMENT FEEDBACK | ☑ | |
| 409 — ELECTRIFICATION PREDICTION MODE | ● | ○ |

Cancel   OK

CHARGED PARTICLE BEAM APPARATUS

TECHNICAL FIELD

The present invention relates to a charged particle beam device.

BACKGROUND ART

At present, inspection/measurement devices of the scanning electron microscope (hereinafter referred to as SEM) type are used in manufacturing lines of semiconductors. These inspection/measurement devices, for inspecting/measuring dimensions of a circuit pattern formed on a wafer, are playing a key role in improvement in the manufacturing yields of manufacturing lines. Further, these inspection/measurement devices are required to observe as many measurement points as possible in a short time. Thus, speeding up the processing power of these devices leads to an increase in production efficiency of semiconductors.

On the other hand, with the miniaturization of semiconductor patterns and the shift to three-dimensional device structure, it is becoming more and more difficult to obtain a high-contrast of the observed part and that is hindering the observation. The contrast of the sample observed by using an electron beam is formed in a state as a mixture of multiple types of information on the material, the electric potential and the shape of the sample. These situations occur because the amount of generation, the emission angle and the emission energy of secondary electrons or backscattered electrons generated from the sample change depending on the material, the electric potential and the shape of the sample and primary electron irradiation conditions (the number of incident electrons per unit time, the incidence angle and the incidence energy). To put it the other way round, the contrast of the part that should be observed can be enhanced by optimizing the primary electron irradiation conditions and properly selecting the emission angle and energy of the secondary electrons or backscattered electrons.

Especially, with an energy filter for selecting an energy range of electrons to be detected, various types of observations can be made possible by increasing its filtering performance (energy resolution). However, the increase in the energy resolution is accompanied by higher susceptibility to fluctuation in the surface potential of the sample. Consequently, the image contrast becomes unstable. Further, other problems also arise such as changes in the filtering property when a plurality of positions on the same sample are observed. In regard to this problem, Patent Document 1 proposes energy filter adjustment performed before the measurement by setting a filtering property calibration point in the sample.

PRIOR ART DOCUMENT

Patent Document

Patent Document 1: JP-1993-172910-A

SUMMARY OF THE INVENTION

Problem to be Solved by the Invention

The SEM-type inspection/measurement devices used in semiconductor lines or the like are required to increase the number or wafers processed per unit time. On the other hand, the use of an energy filter having high energy resolution is effective for increasing the contrast at the time of observation.

In order to maintain the same filtering property at a plurality of measurement points, reference adjustment (calibration) of the energy filter with respect to the surface potential of the sample has to be made at each measurement point. However, for these adjustments, an energy characteristic curve representing the filtering property has to be acquired. This requires to monitor the intensity of a detection signal while changing the filtering intensity, and thus the adjustment takes a long time. The adjustments in conventional devices made at each measurement point include positioning of the measurement point, focus correction of the primary electron beam and so forth, and the time necessary for these adjustments has become equivalent to or longer than the actual observation time. Further, with the addition of the energy filter adjustment time, the adjustment time before the measurement is necessitated to occupy the majority of the processing time of the device, which leads to a drop in the production efficiency of semiconductors.

Incidentally, in the technology disclosed in the Patent Document 1, the adjustment of the energy filter is redone after each focus adjustment. Thus, the device configuration still takes a long time for the adjustment and that lead to a drop in the production efficiency.

Therefore, the present invention provides a technology with which both of the focus correction and the reference adjustment (calibration) of the energy filter can be made from an image acquired from one scan.

Means for Solving the Problem

To resolve the above-described problem, configurations described in claims are employed, for example. While the present application contains multiple means for resolving the above-described problem, an example of the means is as follows. There is provided a charged particle beam device including a charged particle source that generates a charged particle beam, a focus adjustment unit that adjusts a focal position of the charged particle beam, a deflection unit for scanning the charged particle beam on the sample, a detection unit that detects charged particles generated when the sample is irradiated with the charged particle beam, a detected charged particle selection unit that selects charged particles to be detected by the detection unit, and a control processing unit that makes focus adjustment of the focus adjustment unit and reference adjustment of the detected charged particle selection unit by using information from the detection unit acquired from one scan.

Effect of the Invention

According to the present invention, both of the focus correction and the reference adjustment of the energy filter can be made from an image acquired from one scan. Therefore, stable observation of the sample becomes possible without increasing the adjustment time.

Other features related to the present invention will become apparent from the following description and accompanying drawings. Further, problems, configurations and effects other than those described above will be clarified in the following description of the embodiments.

BRIEF DESCRIPTION OF THE DRAWINGS

FIG. 4 shows an example of a screen for making settings of reference adjustment of an energy filter.

MODES FOR CARRYING OUT THE INVENTION

Embodiments of the present invention will be described below with reference to accompanying drawings. Incidentally, while specific embodiments according to the principles of the present invention are shown in the accompanying drawings, these are for the understanding of the present invention and should not be used for interpreting the present invention in a restrictive manner.

A charged particle beam device, scanning a charged particle beam (e.g., electrons) on the surface of a sample and using electrons secondarily generated from the surface, can be taken as an example of a sample observation device. The present invention is generally applicable to such charged particle beam devices.

As a typical example of the charged particle beam device, there is a scanning electron microscope (SEM). The scanning electron microscope forms an image by scanning an electron beam and detecting electrons emitted from the sample. With this device, inspection and measurement of microscopic patterns of semiconductor devices and the like, atomic/molecular level observation of biological samples, and atomic/molecular level observation in material development are possible. The scanning electron microscopes include length measurement-SEMs, review SEMs, etc. The following description will be given of examples of application to a SEM-type length measuring device, for instance.

First Embodiment

Figure 1A:
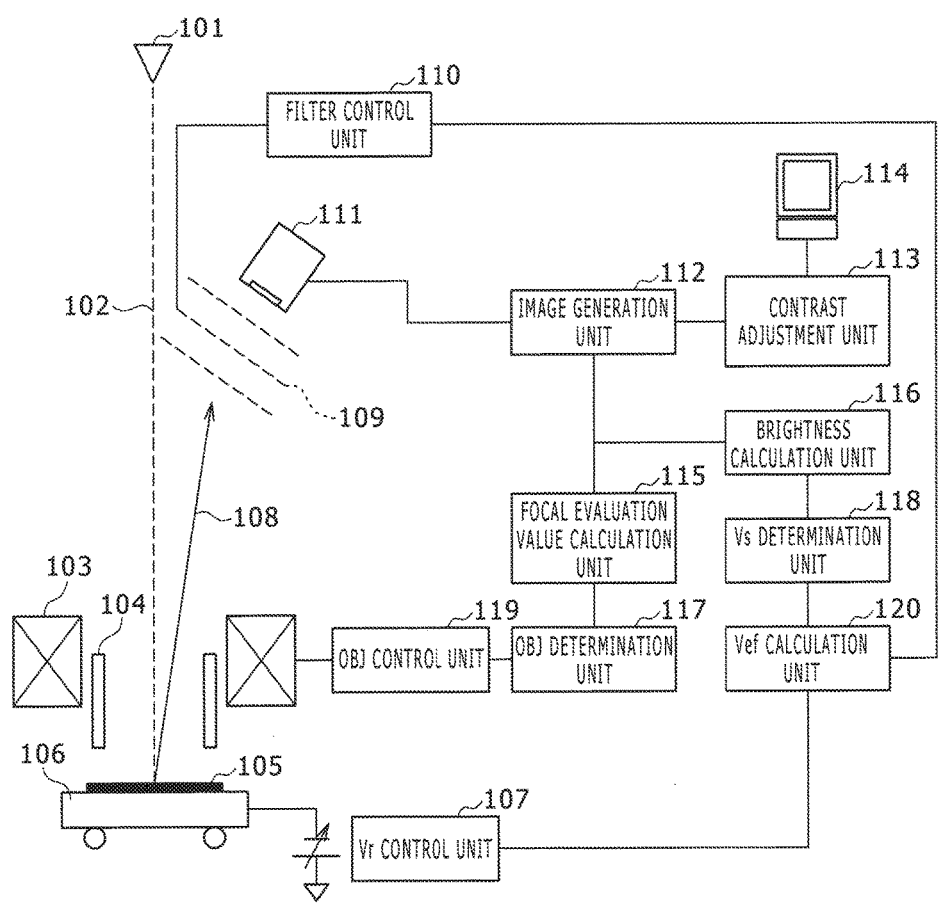
FIG. 1A is a diagram showing the general outline of a SEM-type length measuring device related to a first embodiment.

FIG. 1A shows the configuration of a SEM-type length measuring device related to this embodiment. The SEM-type length measuring device includes an electron beam optical system (charged particle beam optical system) that irradiates a sample with an electron beam, a detection system that detects electrons released from the sample due to the electron beam irradiation, a stage mechanism system that is arranged in a vacuum chamber (not shown), and a control system that controls the components of the SEM-type length measuring device and processes various types of information.

For example, the electron beam optical system includes an electron source (charged particle source) 101 that generates an electron beam (charged particle beam), an objective lens 103 that adjusts the focal position of the electron beam, a deflector 104 for scanning the electron beam on the sample, an energy filter (detected charged particle selection unit) 109, a detector 111, and so forth. Incidentally, the electron beam optical system may further include one or more other lenses, electrodes or detectors, or partially differ from the above-described configuration; the configuration of the electron beam optical system is not limited to this example.

In this SEM-type length measuring device, a primary electron beam 102 generated by the electron source 101 is converged by the objective lens 103 on the sample 105. To generate an image, the primary electron beam 102 is deflected by the deflector 104 and thereby scanned on the sample 105.

The stage mechanism system includes a movable stage 106. The sample 105 is mounted on the movable stage 106 and is electrically floating due to negative voltage supplied from a retarding control unit 107. Accordingly, the primary electron beam 102 experiences a decelerating effect on the sample 105. On the other hand, electrons 108 secondarily generated from the sample 105 are accelerated by the retarding voltage supplied from the retarding control unit 107 and reach the energy filter 109.

The energy filter 109 is formed of mesh-like electrodes. The energy filter 109 is capable of filtering (selecting) electrons to be detected by the detector 111 by using voltage supplied from a filter control unit 110. The filtered electrons reach the detector 111. These electrons turn into a detection signal via a detector amplifier or the like in the detector 111. In FIG. 1A, the detection amplifier is assumed to be built in the detector 111 and is not shown.

The control system includes an objective lens control unit 119, the filter control unit 110 and the retarding control unit 107. In FIG. 1A, only control units relevant to the following explanation are shown and other control units are omitted. The objective lens 103 is controlled by the objective lens control unit 119, and the energy filter 109 is controlled by the filter control unit 110. Further, the retarding voltage applied to the movable stage 106 is controlled by the retarding control unit 107.

The control system further includes an image generation unit 112, a contrast adjustment unit 113, a display unit 114, a focal evaluation value calculation unit 115, a brightness calculation unit 116, an objective lens determination unit 117, a filter characteristic voltage determination unit 118 and a filter voltage calculation unit 120. In the following description, the components of the control system may also be collectively referred to as a control processing unit.

The above-described components of the control system may either be implemented by using a general-purpose computer or implemented as functions of a program executed on a computer. The computer includes at least a processor such as a CPU (Central Processing Unit), a storage unit such as a memory, and a storage device such as a hard disk drive. Processes of the control system which will be explained below may be stored in the memory as program codes and implemented by the processor by executing the each program code. Incidentally, part of the control system may be formed by hardware such as a special-purpose circuit board.

The detection signal from the detector 111 is sent to the image generation unit 112. The image generation unit 112 generates an image by two-dimensionally mapping the intensity of the detection signal based on a two-dimensional scan on the sample 105 performed by using the deflector 104. This embodiment is characterized in that adjustment of the focus and reference adjustment of the energy filter 109 are made based on an image acquired from one scan without changing the energy filter 109, the objective lens 103 and the retarding voltage control units 107, 110 and 119. Here, the "one scan" means images of a minimum number of frames necessary for the adjustment of the focus and the reference adjustment of the energy filter 109. Therefore, the image acquired from one scan may either be one frame of image or multiple frames of images.

The focal evaluation value calculation unit 115 and the brightness calculation unit 116 receive the image from the image generation unit 112 as input information. Incidentally, the image generated by the image generation unit 112 may be sent also to the contrast adjustment unit 113. The contrast adjustment unit 113 may adjust the contrast of the image and output the adjusted image to the display unit 114. This allows the user to check the image generated by the image generation unit 112 on the display unit 114.

The focal evaluation value calculation unit 115 calculates a focal evaluation value from the image and outputs the focal evaluation value to the objective lens determination unit 117. The objective lens determination unit 117 determines intensity of the objective lens 103 to be set next based on the focal evaluation value. The objective lens determination unit 117 outputs the determined intensity to the objective lens control unit 119. The objective lens control unit 119 controls the objective lens 103 based on the received intensity.

Meanwhile, the brightness calculation unit 116 calculates the brightness from the image and outputs the brightness to the filter characteristic voltage determination unit 118. The filter characteristic voltage determination unit 118 determines a filter characteristic voltage value (Vs value) to be set next based on the brightness. The filter characteristic voltage determination unit 118 outputs the determined Vs value to the filter voltage calculation unit 120. Incidentally, to the filter voltage calculation unit 120, information from the retarding control unit 107 (Vr which will be explained later) is also inputted. The filter voltage calculation unit 120 calculates a voltage Vef (reference intensity) to be applied to the energy filter 109 in response to the information (Vr) from the retarding control unit 107 and the Vs value. The filter voltage calculation unit 120 outputs the calculated voltage Vef to the filter control unit 110. The filter control unit 110 controls the voltage of the energy filter 109 based on the received voltage Vef.

Figure 1B:
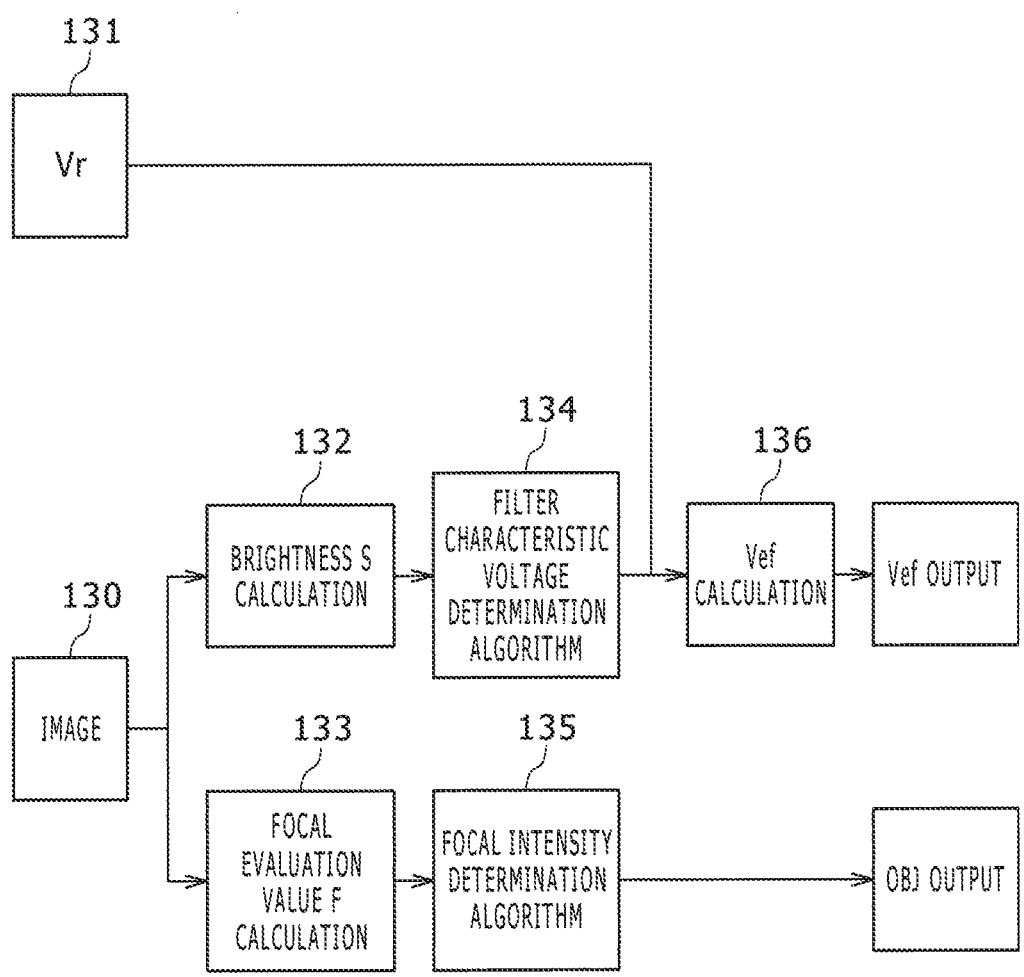
FIG. 1B is a diagram showing the general outline of inputs and outputs of a sequence related to the first embodiment.

FIG. 1B is a diagram showing the general outline of inputs and outputs of a sequence related to the first embodiment. The image 130 is the image acquired from one scan without changing the energy filter 109, the objective lens 103 and the retarding voltage control units 107, 110 and 119.

The focal evaluation value calculation unit 115 and the brightness calculation unit 116 receive the image 130 from the image generation unit 112 as the input information. The focal evaluation value calculation unit 115 calculates the focal evaluation value F from the image 130 (133) and outputs the focal evaluation value F to the objective lens determination unit 117. The objective lens determination unit 117 performs a focal intensity determination algorithm (135) and outputs the intensity OBJ of the objective lens 103 to be set next.

The brightness calculation unit 116 calculates the brightness S from the image 130 (132) and outputs the brightness S to the filter characteristic voltage determination unit 118. The filter characteristic voltage determination unit 118 performs a filter characteristic voltage determination algorithm (134) and outputs the filter characteristic voltage value (Vs value) to be set next to the filter voltage calculation unit 120. The filter voltage calculation unit 120 calculates the voltage Vef to be applied to the energy filter 109 based on the retarding voltage (Vr) 131 and the Vs value (136).

Figure 2:
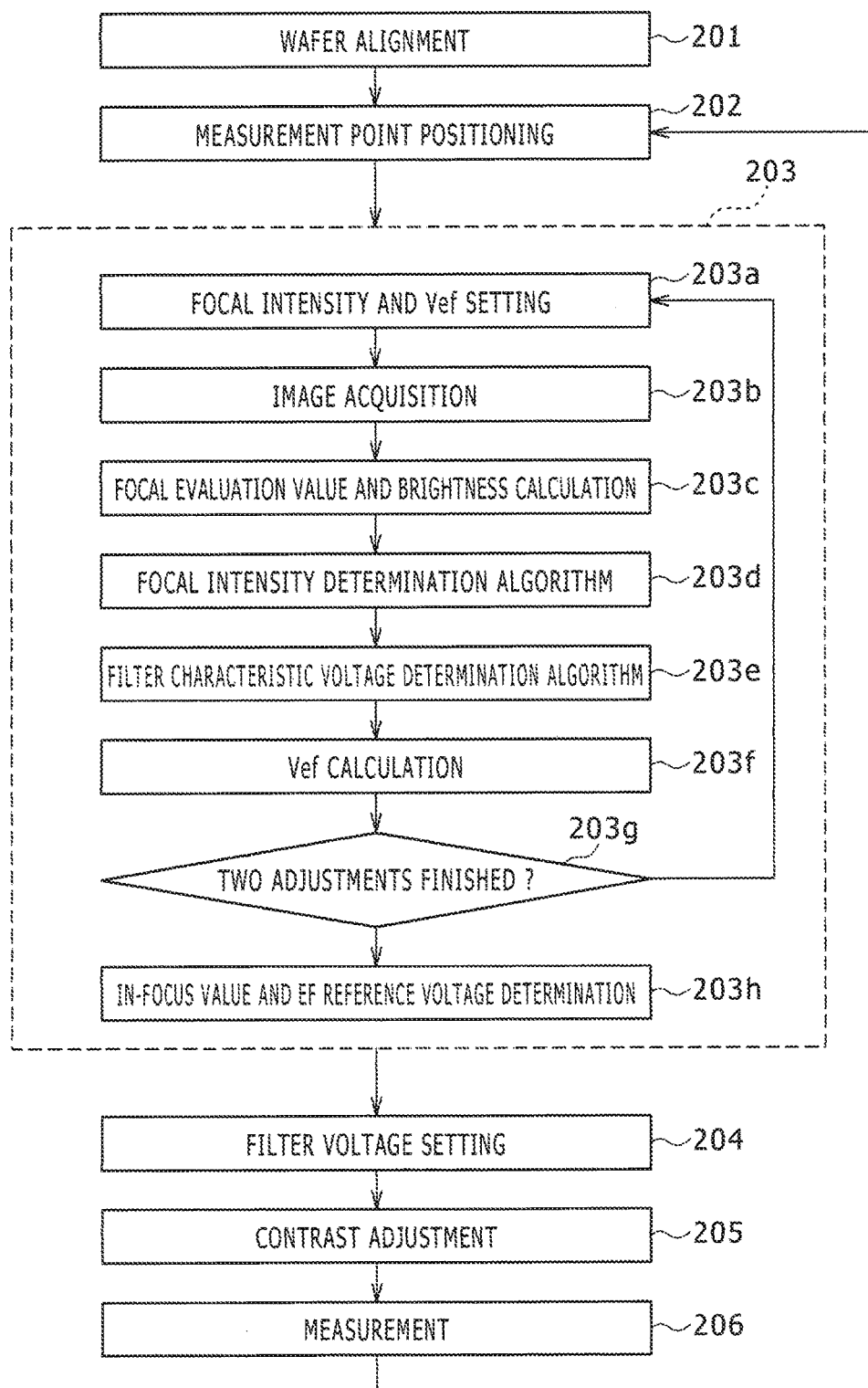
FIG. 2 is a flow chart showing a measurement method using the SEM-type length measuring device related to the first embodiment.

FIG. 2 is a flow chart showing a measurement method using the SEM-type length measuring device related to this embodiment. After the sample 105 is loaded on the movable stage 106, wafer alignment is carried out first, in which the sample 105 is rotated and initial coordinates are calibrated (201).

Subsequently, measurement point positioning is carried out, in which a measurement point registered by the user and the primary electron beam 102 are relatively positioned to each other (202). While this positioning includes movement of the movable stage 106, position adjustment of the primary electron beam, etc., details of these operations are omitted here.

Subsequently, focus adjustment in the vicinity of the measurement point and the reference adjustment of the energy filter 109 are carried out (203). Thereafter, the filter voltage to be applied to the energy filter 109 is set based on a filter characteristic voltage specified by the user (204). Subsequently, contrast adjustment for adjusting the brightness and the contrast of the display image is carried out (205). Thereafter, the measurement at the measurement point is carried out (206). In the contrast adjustment step 205, a gain value and an offset value of the detector 111 are also adjusted. It is to be noted that when there exists the next measurement point, the process returns to the step 202 and the steps 203 to 206 are executed again.

Next, details of the step 203 in FIG. 2 will be described. In the step 203, both of the focus adjustment in cases where the objective lens 103 is used for the focus adjustment and the reference adjustment (calibration) of the energy filter 109 are performed.

First, initial setting values (the intensity OBJ and the filter characteristic voltage Vs) are received as input information, the objective lens control unit 119 sets the intensity of the objective lens 103, and the filter control unit 110 sets the voltage applied to the energy filter 109 (203a). These settings in this step are initial settings for acquiring an image from one scan in the next step 203b.

Subsequently, the image generation unit 112 generates an image from one scan and outputs the image to the focal evaluation value calculation unit 115 and the brightness calculation unit 116 (203b). Subsequently, the focal evaluation value calculation unit 115 calculates the focal evaluation value from the image and the brightness calculation unit 116 calculates the brightness from the image (203c).

Figure 3A:
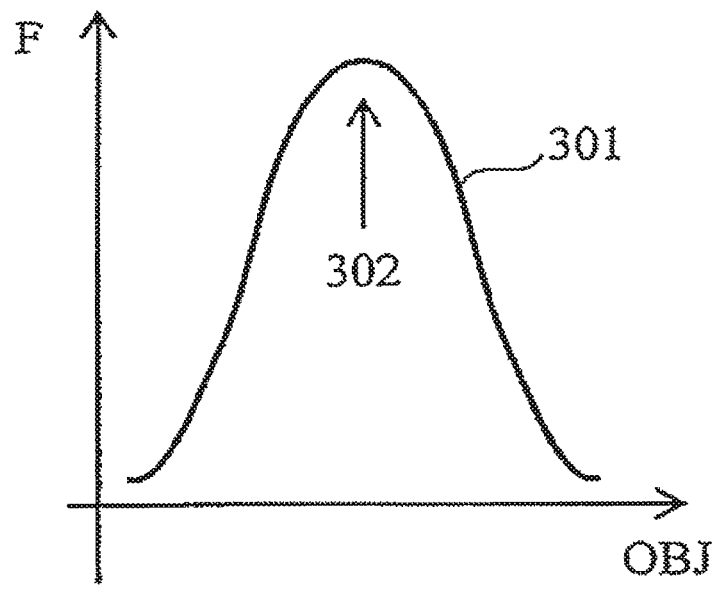
FIG. 3A is a diagram showing an example of a focus characteristic curve.

Subsequently, the objective lens determination unit 117 performs the focal intensity determination algorithm by using the focal evaluation value (203d). FIG. 3A shows a typical example of the focal evaluation value F plotted when the intensity OBJ changes in the focus adjustment. The focus characteristic curve F(OBJ) 301 is a curve indicating the relationship between the intensity OBJ of the objective lens and the focal evaluation value F. In FIG. 3A, the extreme value 302 of the focus characteristic curve F(OBJ) 301 represents the in-focus position. In the focal intensity determination algorithm step (203d), the focal intensity is changed until the extreme value 302 can be decided and a flag representing the end of the focal intensity adjustment is set to on when the extreme value 302 is decided successfully.

Figure 3B:
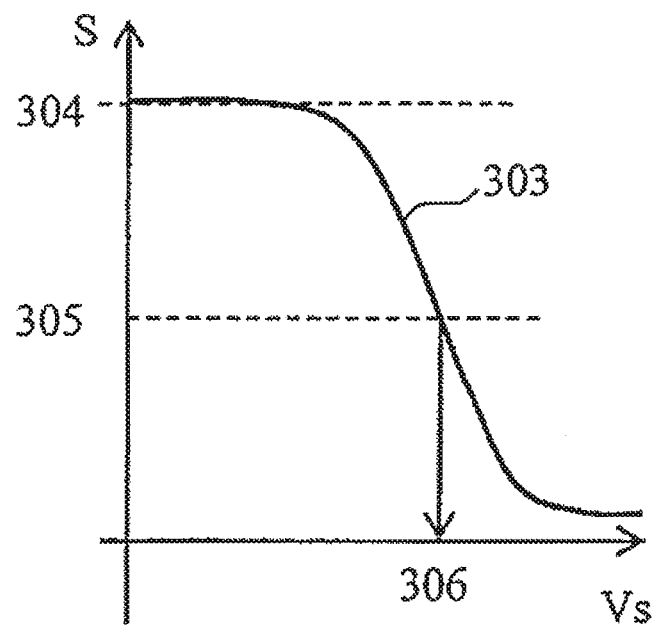
FIG. 3B is a diagram showing an example of an energy characteristic curve.

Subsequently, the filter characteristic voltage determination unit 118 performs the filter characteristic voltage determination algorithm by using the brightness (203e). FIG. 3B shows a typical example of the change in the brightness S plotted when the filter characteristic voltage Vs is changed. The energy characteristic curve 303 is a curve indicating the relationship between the filter characteristic voltage Vs and the brightness S. As indicated by the following expression (1), the filter characteristic voltage Vs is represented by the surface potential Vsample of the sample 105 and the voltage Vef applied to the energy filter 109. The Vsample equals the retarding voltage Vr applied to the sample 105 as long as the sample 105 has no electrification or the like. Thus, in this embodiment, the retarding voltage Vr is handled to be equal to Vsample.

$$Vs = -Vef + Vsample \quad (1)$$

As long as the sample 105 has no electrification or the like, when the voltage Vs becomes positive, the filter voltage becomes higher than the electric potential at the time of emission, and thus electrons are filtered out starting from those with low energy. In reality, calibration of the energy filter 109 becomes necessary since the energy characteristic curve 303 shifts rightward and leftward due to changes in the surface potential caused by electrification of the sample 105.

There is a well-known method of determining the electrification potential of the sample based on the deviation from a characteristic curve regarding the case where the sample 105 has no electrification. In FIG. 3B, the reference voltage of the energy filter 109 is set at a Vs value 306 corresponding to brightness 305 as ½ of the maximum value 304 of S(Vs). The reference voltage can be set freely at the time of designing since the calibration of the energy filter 109 is just for making it possible to decide the deviation in the characteristic curve. Therefore, the reference voltage can be set at an arbitrary ratio with respect to the maximum value of S(Vs). In this step, Vs is changed until the reference voltage (Vs value 306) defined at the time of designing can be decided. In contrast, when the reference voltage (Vs value 306) is decided successfully, an end flag is set to on.

Subsequently, the filter voltage calculation unit 120 calculates the voltage Vef to be applied to the energy filter 109 based on the relationship of the expression (1) by using Vr from the retarding control unit 107 and Vs from the filter characteristic voltage determination unit 118 (203f). Subsequently, whether the two adjustments have finished or not is decided by referring to both of the end flags of the focal intensity algorithm step 203d and the filter characteristic voltage determination algorithm step 203e (203g). When either one of the end flags is still off, the process returns to the step 203a.

Finally, the objective lens determination unit 117 determines the intensity of the objective lens 103 to be set next and the filter voltage calculation unit 120 determines the voltage (reference intensity) Vef to be set next to be applied to the energy filter 109 (203h). The objective lens determination unit 117 outputs the determined intensity to the objective lens control unit 119. Further, with reference to the voltage Vef determined in this step, the voltage the user actually intends to apply to the energy filter 109 is set in the next step 204. Incidentally, the filter voltage calculation unit 120 may output the determined voltage Vef to the filter control unit 110.

With the configuration described above, the focal evaluation value and the brightness can be calculated from the image acquired from one scan, and the focus correction and the reference adjustment of the energy filter 109 can be made at the same time.

Further, the gain value and the offset value of the detector 111 can be predicted from the brightness information calculated at the time of these adjustments, and thus it also becomes possible to shorten or omit the time of the contrast adjustment performed before the image acquisition. Therefore, the control system may also include a prediction unit that automatically predicts the gain value and the offset value of the detector 111 from the calculated brightness information.

Furthermore, the reference voltage of the energy filter 109 is an index value of the sample surface potential, and thus it becomes possible to predict the electrification amount of the sample 105. By calibrating the magnification and the positioning of the primary electron beam based on the electrification amount of the sample 105, increasing the accuracy of the magnification and the positioning also becomes possible.

FIG. 4 shows an example of a screen for making settings of the reference adjustment of the energy filter that is displayed on the display unit 114. The screen includes a first setting part 401 for setting the timing of making the reference adjustment of the energy filter and a second setting part 402 for making basic settings regarding coordinates, magnification, scan type, the number of frames, filter reference brightness, etc. In the example of FIG. 4, a setting for making the reference adjustment of the energy filter 109 for each measurement point has been made in the first setting part 401. Incidentally, settings for making the adjustment every periodic point (e.g., every five times) or only at the initial point are also possible.

The screen includes a third setting part 403 for selecting whether or not to make the focus correction and the reference adjustment of the energy filter at the same time. The third setting part 403 includes a first selection part 404 for selecting whether or not to incorporate the brightness being adjusted into the gain value and the offset value of the detector.

The screen of FIG. 4 also includes some setting parts for settings in embodiments described below. These setting parts will be explained later. Incidentally, part of the screen of FIG. 4 may be deleted depending on the embodiment.

Second Embodiment

Figure 5A:
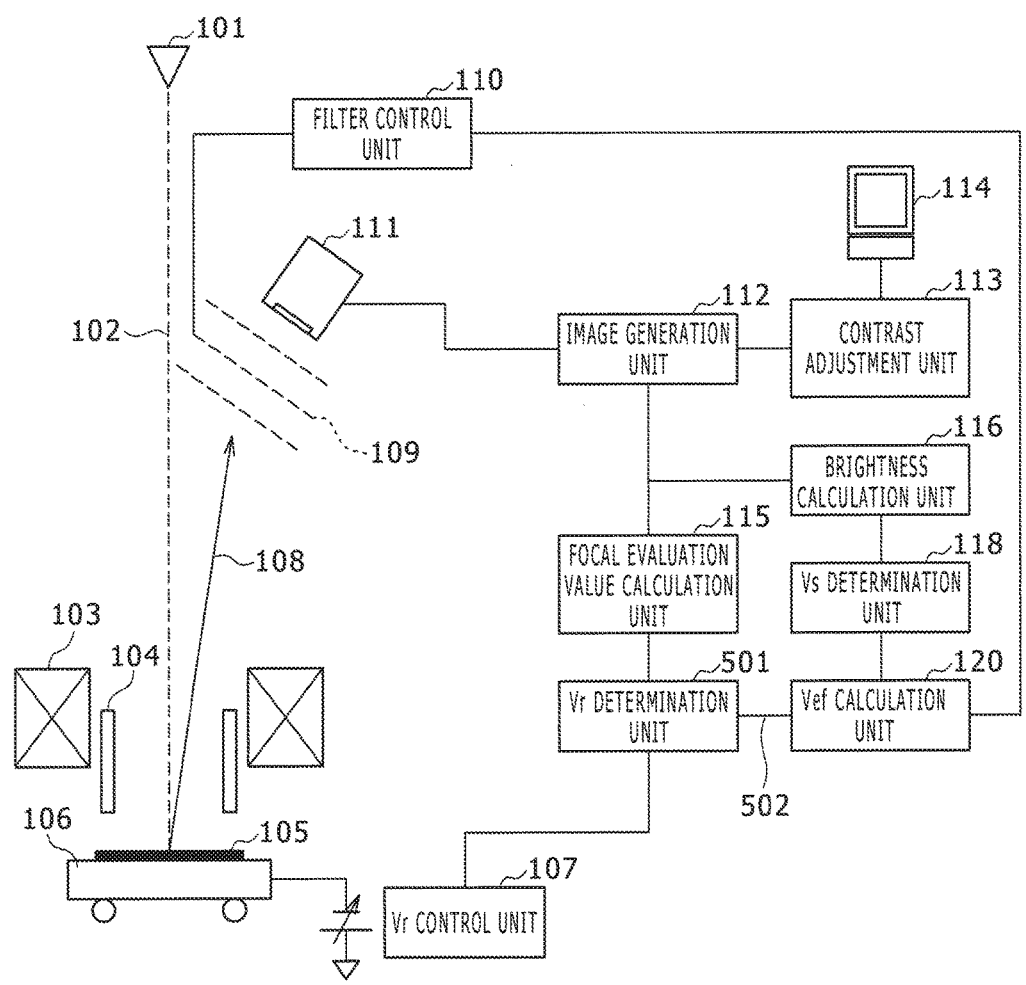
FIG. 5A is a diagram showing the general outline of a SEM-type length measuring device related to a second embodiment.

FIG. 5A shows an example of the configuration of a SEM-type length measuring device related to a second embodiment. In this embodiment, a configuration in a case where the retarding voltage is used for the focus adjustment will be explained. This embodiment differs from the first embodiment in that the SEM-type length measuring device includes a retarding voltage determination unit 501.

The signal from the focal evaluation value calculation unit 115 (focal evaluation value) is outputted to the retarding voltage determination unit 501. The retarding voltage determination unit 501 performs a focal intensity determination algorithm and thereby determines the retarding voltage Vr. The retarding voltage determination unit 501 outputs the determined retarding voltage Vr to the retarding control unit 107.

Here, the retarding voltage determination unit 501 outputs the determined retarding voltage Vr also to the filter voltage calculation unit 120 via a path 502. The filter voltage calculation unit 120 determines the voltage Vef to be applied to the energy filter 109 by using the retarding voltage Vr determined (updated) by the retarding voltage determination unit 501.

Figure 5B:
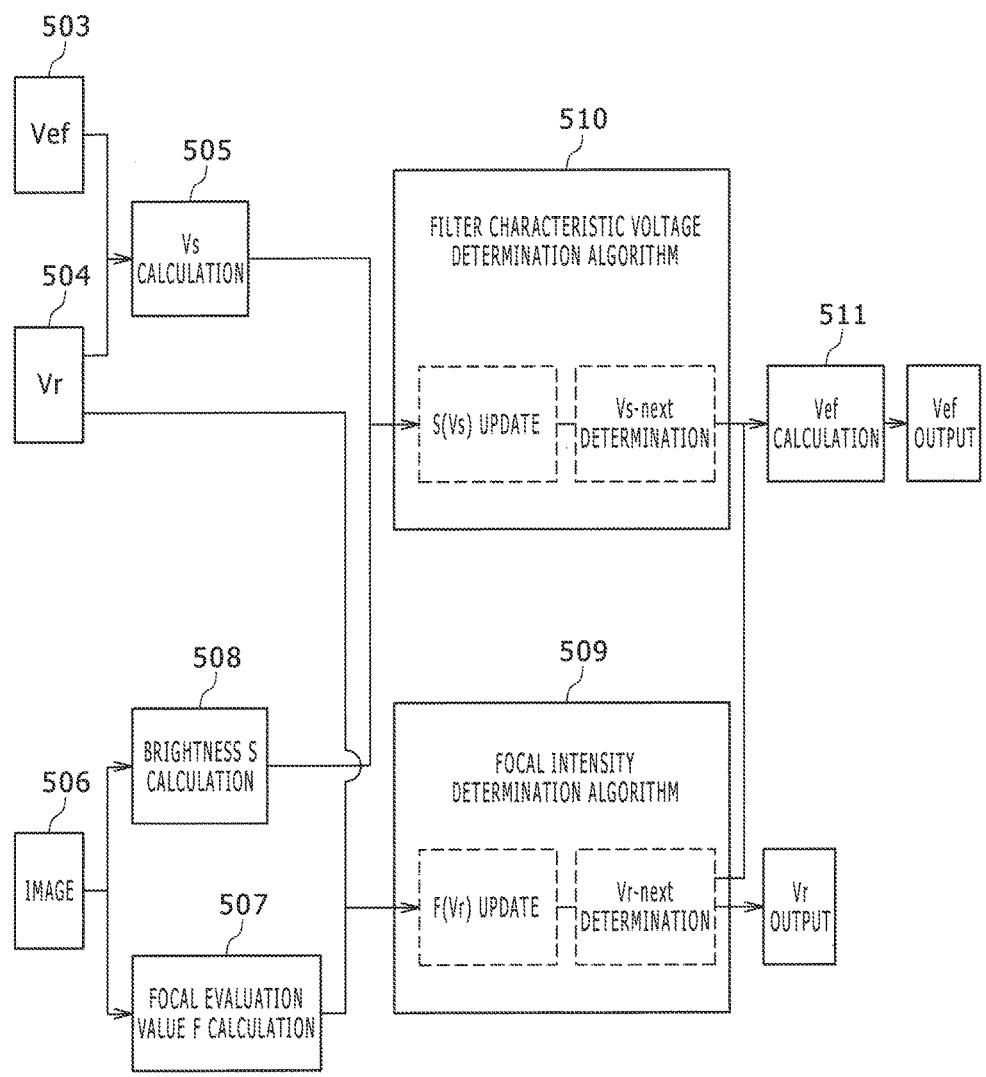
FIG. 5B is a diagram showing the general outline of inputs and outputs of a sequence related to the second embodiment.

FIG. 5B is a diagram showing the general outline of inputs and outputs of a sequence related to the second embodiment. The image 506 is the image acquired from one scan in a state with the intensity (Vef) 503 of the energy filter 109 and the retarding voltage (Vr) 504. The focal evaluation value calculation unit 115 and the brightness calculation unit 116 receive the image 506 from the image generation unit 112 as input information.

The focal evaluation value calculation unit 115 calculates the focal evaluation value F from the image 506 (507) and outputs the focal evaluation value F to the retarding voltage determination unit 501. The retarding voltage determination unit 501 receives the current retarding voltage (Vr) 504 and focal evaluation value F as input information and performs the focal intensity determination algorithm 509.

While the focus characteristic curve F(OBJ) indicating the relationship between the intensity OBJ of the objective lens 103 and the focal evaluation value F is used in the first embodiment, the focal intensity determination algorithm 509 in this embodiment uses a focus characteristic curve F(Vr) indicating the relationship between the retarding voltage Vr and the focal evaluation value F. The retarding voltage determination unit 501 updates the focus characteristic curve F(Vr), changes the focal intensity until an extreme value can be decided, for example, and determines the focal intensity at the extreme value as the next retarding voltage (Vr-next). The retarding voltage determination unit 501 outputs the next retarding voltage (Vr-next) to the retarding control unit 107 and the filter voltage calculation unit 120.

Meanwhile, to the filter characteristic voltage determination unit 118, the intensity (Vef) 503 of the energy filter 109 and the retarding voltage (Vr) 504 for changing the focal intensity are inputted as current information. The filter characteristic voltage determination unit 118 calculates the filter characteristic voltage (Vs) based on the expression (1) (505).

Further, the brightness calculation unit 116 calculates the brightness S from the image 506 (508) and outputs the brightness S to the filter characteristic voltage determination unit 118. The filter characteristic voltage determination unit 118 performs a filter characteristic voltage determination algorithm 510 by using the brightness S supplied from the brightness calculation unit 116 and the filter characteristic voltage (Vs) 505. In the filter characteristic voltage determination algorithm 510 in this embodiment, the energy characteristic curve S(Vs) indicating the relationship between the filter characteristic voltage Vs and the brightness S is used similarly to the first embodiment.

The filter characteristic voltage determination unit 118 updates the energy characteristic curve S(Vs) and determines the next filter characteristic voltage (Vs-next). The filter characteristic voltage determination unit 118 outputs the next filter characteristic voltage (Vs-next) to the filter voltage calculation unit 120. Thus, in this embodiment, the next filter characteristic voltage is calculated from the relationship among the intensity of the energy filter 109, the intensity of the retarding voltage and the brightness.

The filter voltage calculation unit 120 calculates the next filter voltage (Vef) based on the relationship of the expression (1) by using the next retarding voltage (Vr-next) and the next filter characteristic voltage (Vs-next) (511) and outputs the calculated next filter voltage (Vef). As above, Vef for the reference adjustment of the energy filter 109 can be determined based on the next Vr change due to the focus adjustment and the next Vs change due to the reference adjustment.

Third Embodiment

Figure 6:
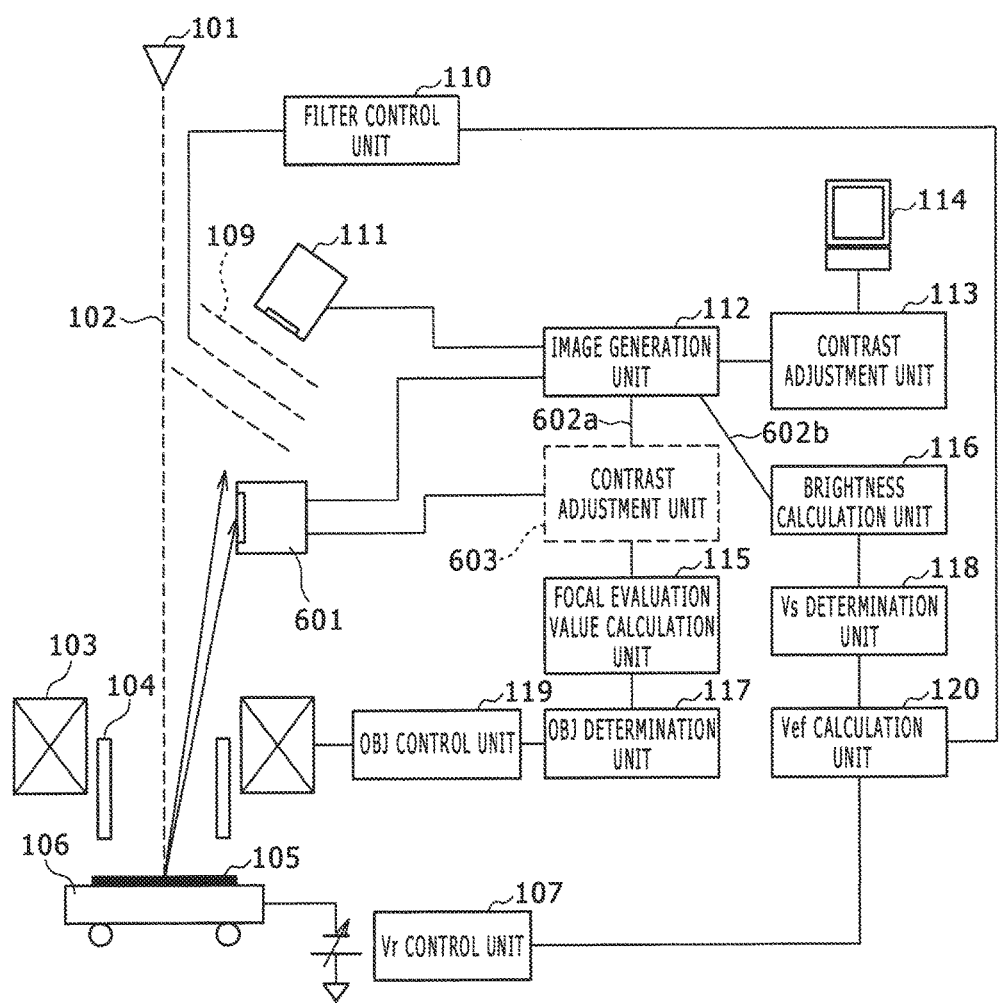
FIG. 6 is a diagram showing the general outline of a SEM-type length measuring device related to a third embodiment.

FIG. 6 shows an example of the configuration of a SEM-type length measuring device related to a third embodiment. In this embodiment, the detection system of the SEM-type length measuring device includes a plurality of detectors. Specifically, the detection system includes a detector 111 having a detected electron selection unit (the energy filter 109 in this example) and a detector 601 not having the detected electron selection unit.

The image generation unit 112 generates a plurality of images in regard to one scan by using the detection signals acquired by the detectors 601 and 111. The image generated from the detection signal of the detector 601 is sent to the focal evaluation value calculation unit 115 via a path 602a. The processing of the focus correction after the image is sent to the focal evaluation value calculation unit 115 may be performed by the same method as in the first embodiment. Since the detector 601 does not include the detected electron selection unit (energy filter), the brightness does not change in the images generated from the detection signal from the detector 601. Therefore, the image brightness is stabilized at the time of the focus correction and high accuracy of the focus adjustment can be maintained.

Incidentally, a contrast adjustment unit 603 may be added between the image generation unit 112 and the focal evaluation value calculation unit 115 as shown in FIG. 6. The contrast adjustment unit 603 is a unit for making contrast adjustment in regard to the image generated from the detection signal of the detector 601.

Meanwhile, the image generated from the detection signal of the detector 111 is sent to the brightness calculation unit 116 via a path 602b and used for the reference adjustment of the energy filter 109. The processing of the reference adjustment of the energy filter 109 after the image is sent to the brightness calculation unit 116 may be performed by the same method as in the first embodiment.

With the configuration described above, the image generated by the detector 601 not having the detected electron selection unit is utilized for the focus correction and the image generated by the detector 111 having the detected electron selection unit (the energy filter 109 in this example) is utilized for the reference adjustment of the energy filter 109. Therefore, the image brightness is stabilized at the time of the focus adjustment and the adjustment of the detected electron selection means (energy filter 109) also becomes possible while maintaining high accuracy of the focus adjustment.

Fourth Embodiment

Figure 7:
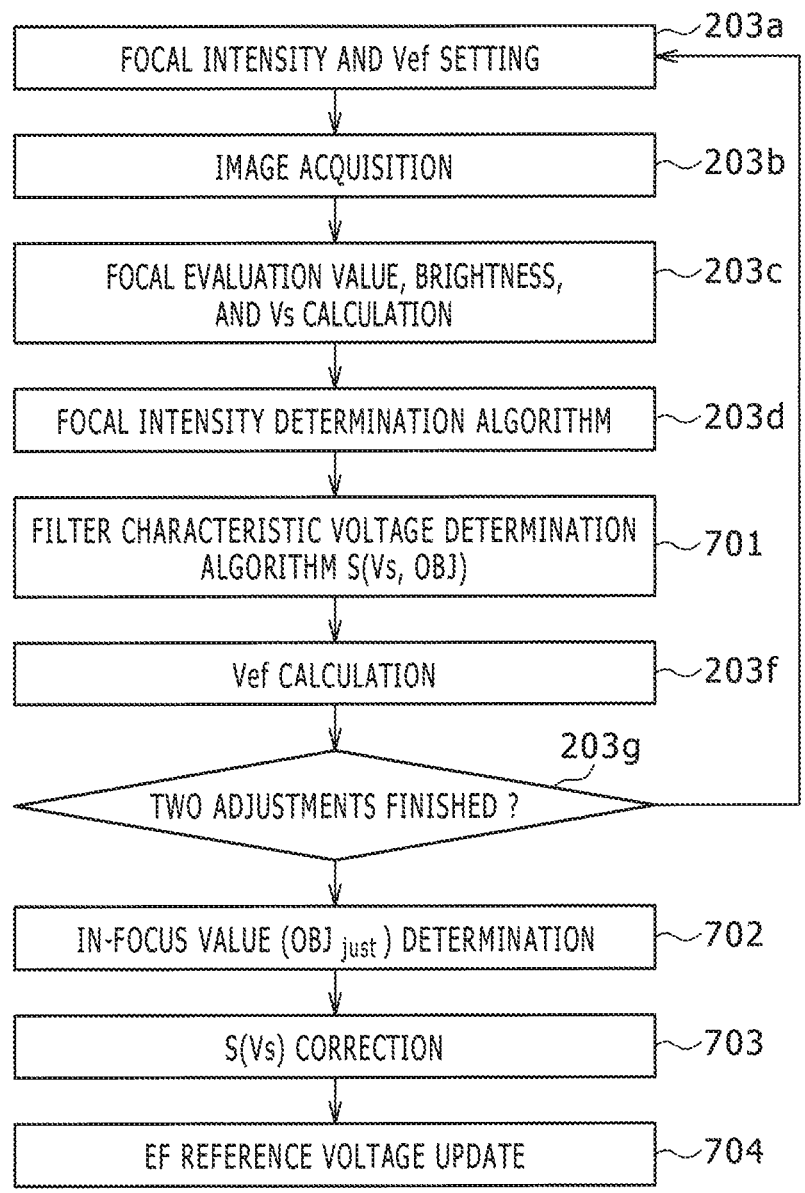
FIG. 7 is a flow chart showing a part of a measurement method using a SEM-type length measuring device related to a fourth embodiment.

FIG. 7 is a flow chart showing a part of a measurement method related to a fourth embodiment. This embodiment is characterized in a sequence in the step S203 in FIG. 2, and other sequences are equivalent to those in FIG. 2. Steps in FIG. 7 identical with those in FIG. 2 are assigned the same reference symbols as in FIG. 2 and repeated explanation thereof is omitted.

The brightness of an image acquired at a time of being out of focus can differ from the brightness at a time of being in focus. Therefore, a correction formula $\Delta S(\Delta OBJ)$ according to the deviation $\Delta OBJ$ from the in-focus state is previously registered in a prescribed storage unit of the control processing unit.

The focus adjustment and the reference adjustment of the energy filter are made (203) according to the flow in the first embodiment shown in FIG. 2. In this embodiment, the filter characteristic voltage determination unit 118 performs a filter characteristic voltage determination algorithm (701). The energy characteristic curve in the filter characteristic voltage determination algorithm 701 is assumed to be a curve S(Vs, OBJ) in regard to the intensity of a focus adjustment unit (e.g., the objective lens) at the time of image acquisition. That is to say, this energy characteristic curve S(Vs, OBJ) is a curve associated with the intensity of the objective lens and the filter characteristic voltage. However, the algorithm for determining the reference voltage of the energy filter 109 is performed in the same way as in the first embodiment.

The adjustment is ended by the end decision (203g) and an in-focus value ($OBJ_{just}$) is determined (702). Information on the in-focus value ($OBJ_{just}$) can be acquired from the objective lens determination unit 117, for example. Thereafter, the energy characteristic curve S(Vs, OBJ) is corrected based on the in-focus value ($OBJ_{just}$) and the correction formula $\Delta S(\Delta OBJ)$, and S(Vs) is calculated (703). Then, the newly calculated reference voltage of the energy filter 109 is employed as the final result (i.e., the reference voltage is updated) (704).

Next, details of the above-described steps 701 to 704 will be explained below. The subject performing the following processes is the control processing unit.

Figure 8A:
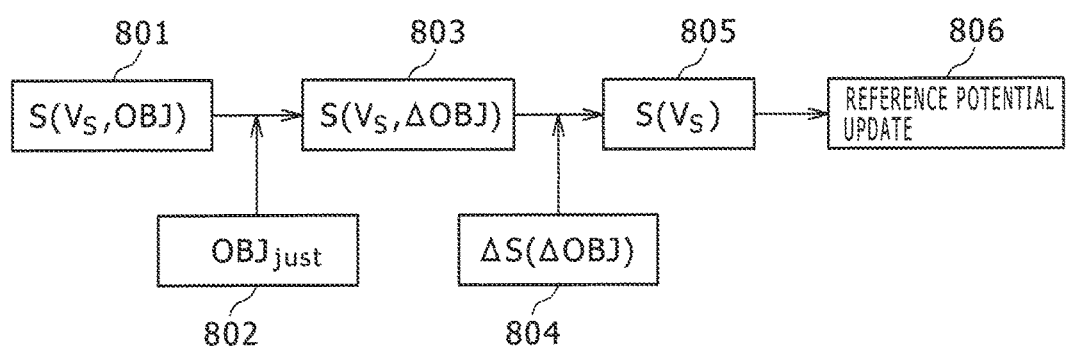
FIG. 8A is a diagram showing the general outline of a method for correcting the energy characteristic curve related to the fourth embodiment.

FIG. 8A shows the general outline of a method for correcting the energy characteristic curve. First, S(Vs, OBJ) 801 obtained by the filter characteristic voltage determination algorithm 701 is converted into S(Vs, $\Delta OBJ$) 803 by using the in-focus value ($OBJ_{just}$) 802. This means that after the determination of the in-focus value ($OBJ_{just}$), the deviation $\Delta OBJ$ indicating the degree of deviation from the in-focus position is calculated based on the focal position of the acquired image and the deviation $\Delta OBJ$ is applied to S(Vs, OBJ) 801.

Figure 8B:
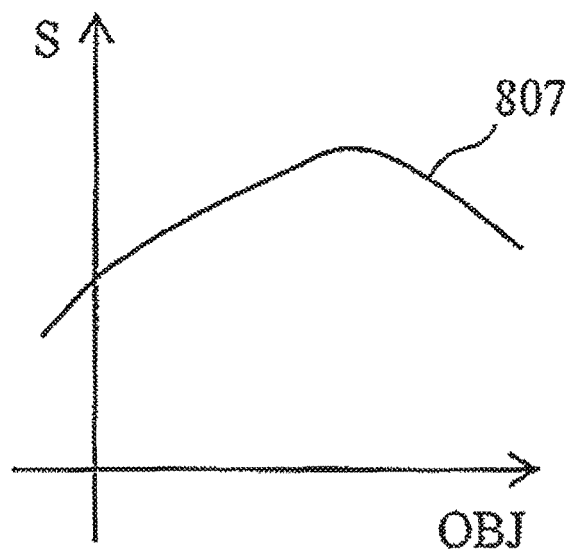
FIG. 8B is a diagram showing an example of the relationship between intensity of an objective lens and brightness related to the fourth embodiment.

FIG. 8B is a diagram showing the relationship between the intensity of the objective lens and the brightness. It is assumed in this embodiment that the relationship S(OBJ) 807 between the intensity of the objective lens and the brightness like the one shown in FIG. 8B has been acquired previously and registered in a prescribed storage unit of the control processing unit. Information on the change in the brightness with respect to the focus deviation $\Delta OBJ$ can be obtained from the deviation $\Delta OBJ$ and the S(OBJ) 807, and the correction formula $\Delta S(\Delta OBJ)$ 804 is calculated from this information. Thus, the correction formula $\Delta S(\Delta OBJ)$ 804 is a correction formula obtained from the relationship between the change in the intensity of the objective lens 103 and the change in the brightness.

Figure 8C:
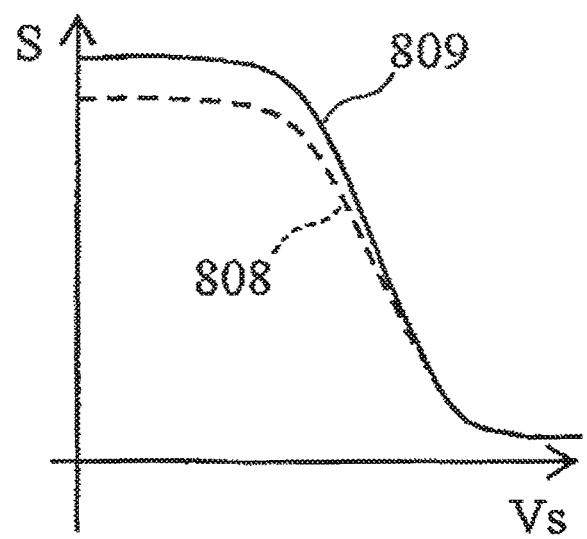
FIG. 8C is a diagram showing an example of the energy characteristic curves before and after correction related to the fourth embodiment.

Therefore, the energy characteristic curve S(Vs, $\Delta OBJ$) 803 is converted into the corrected energy characteristic curve S(Vs) 805 by using the correction formula $\Delta S(\Delta OBJ)$ 804 calculated from the in-focus value ($OBJ_{just}$) 802 and the S(OBJ) 807. FIG. 8C shows an example of the energy characteristic curves before and after the correction. Since the brightness changes according to the intensity of the objective lens 103, an energy characteristic curve 808 before the correction is converted into an energy characteristic curve 809. Then, by using the corrected energy characteristic curve S(Vs) 805, the reference voltage of the energy filter 109 is determined (806).

According to this embodiment, it becomes possible to make the adjustment of the focal intensity and the reference adjustment of the energy filter at the same time even in cases where the brightness changes when the image is acquired at a time of being out of focus.

Incidentally, when a configuration including two detectors is employed as shown in FIG. 6, the control processing unit may calculate both the focal evaluation value and the brightness from the image acquired from the detector 601 not having the detected electron selection unit (energy filter) and update the correction formula $\Delta S(\Delta OBJ)$ based on the change in the brightness upon each measurement.

Whether or not to make these corrections can be set on the screen shown in FIG. 4. The third setting part 403 may include a second selection part 405 for selecting whether or not to correct the reference voltage according to the change in the brightness.

Fifth Embodiment

Figure 9:
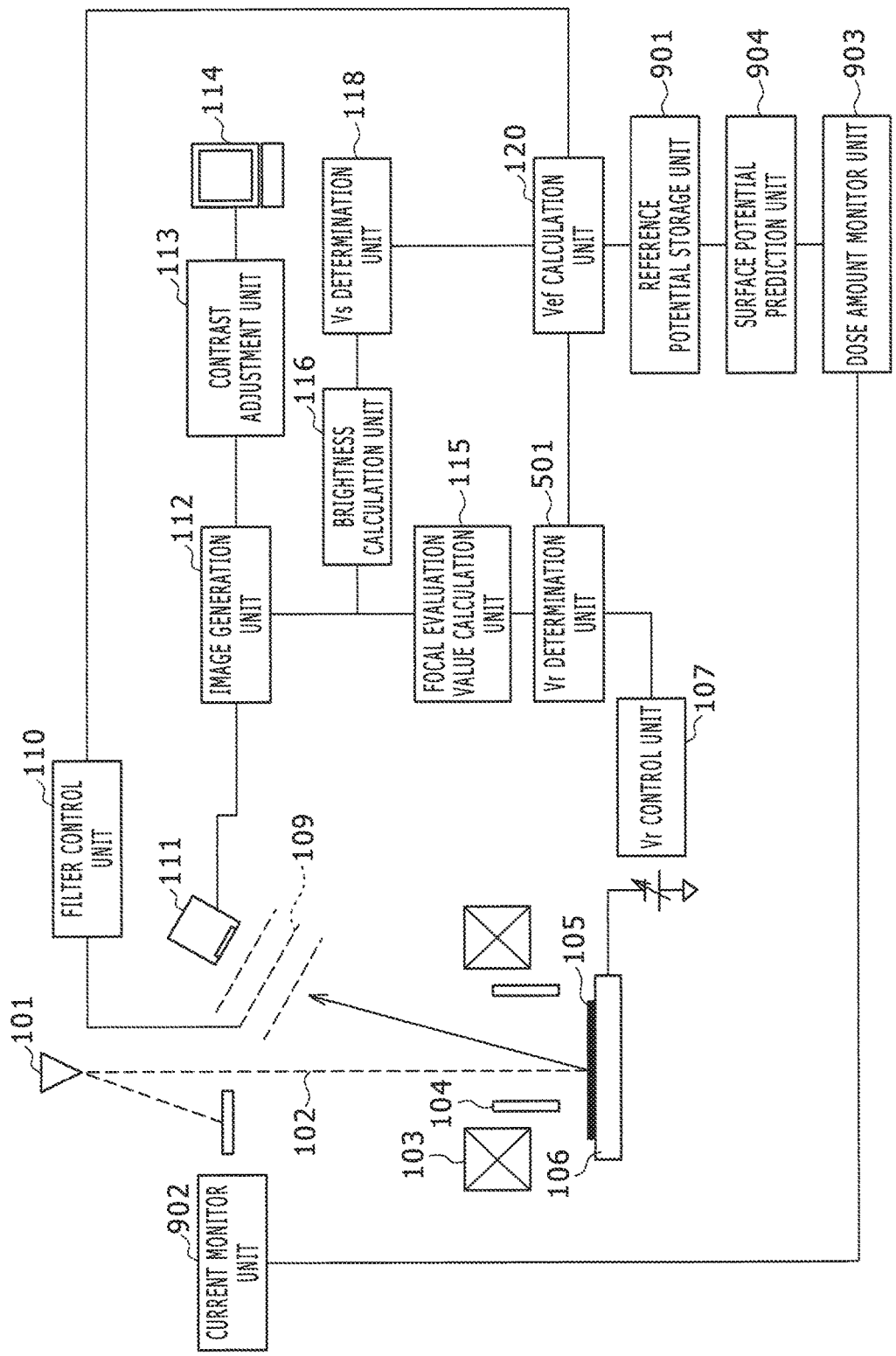
FIG. 9 is a diagram showing the general outline of a SEM-type length measuring device related to a fifth embodiment.

FIG. 9 shows the configuration of a SEM-type length measuring device related to a fifth embodiment. Components in FIG. 9 identical with those in FIG. 5A are assigned the same reference symbols as in FIG. 5A and repeated explanation thereof is omitted.

The SEM-type length measuring device in this embodiment includes a reference potential storage unit 901 that records the reference voltage Vef of the energy filter 109 upon each adjustment of the energy filter 109, a current monitor unit 902 that monitors probe current, a dose amount monitor unit 903 that calculates a dose amount from the result of monitoring the probe current and the number of scans, and a surface potential prediction unit 904 that predicts the change in the sample electrification potential based on the relationship between the reference potential storage unit 901 and the dose amount monitor unit 903.

Figure 10:
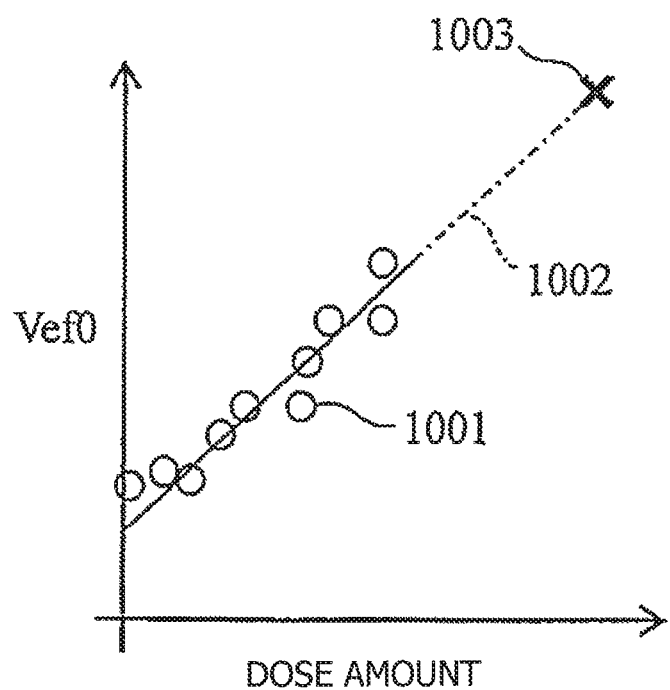
FIG. 10 shows an example of changes in a dose amount and reference voltage.

FIG. 10 shows the result of measurement of changes in the dose amount and the reference voltage Vef0. In the example of FIG. 10, referring to the measurement points 1001 obtained by plotting the relationship between the dose amount and the reference voltage, the reference voltage changes linearly with respect to the dose amount. This indicates that the change in the reference voltage is caused by the electrification of the sample, and the reference voltage 1003 after repeated measurement can be predicted from the linear approximation line 1002. The surface potential prediction unit 904 predicts the reference voltage 1003 after repeated measurement based on the relationship between the information from the reference potential storage unit 901 and the information from the dose amount monitor unit 903. Incidentally, while an example of linear approximation is explained here, it is also possible to perform a different type of approximation process such as curve approximation.

If the influence of the electrification potential of the sample at the next measurement point can be predicted as above, it becomes possible to increase the magnification and the positional accuracy by calibrating magnification fluctuation and displacement of the primary electron beam. In other words, the magnification may be corrected by controlling the electron beam optical system by using a prediction value obtained from the result of monitoring the aforementioned electrification amount. Further, the displacement may be corrected by controlling the electron beam optical system or the movable stage 106 by using a prediction value obtained from the result of monitoring the electrification amount.

Whether or not to make these corrections can be set on the screen shown in FIG. 4. The screen of FIG. 4 may include a fourth setting part 406 for setting whether or not to make correction based on the monitoring of the electrification amount. The fourth setting part 406 may include a third selection part 407 for selecting whether or not to correct the magnification based on the monitoring of the electrification amount and a fourth selection part 408 for selecting whether or not to correct the displacement based on the monitoring of the electrification amount.

Sixth Embodiment

Figure 11:
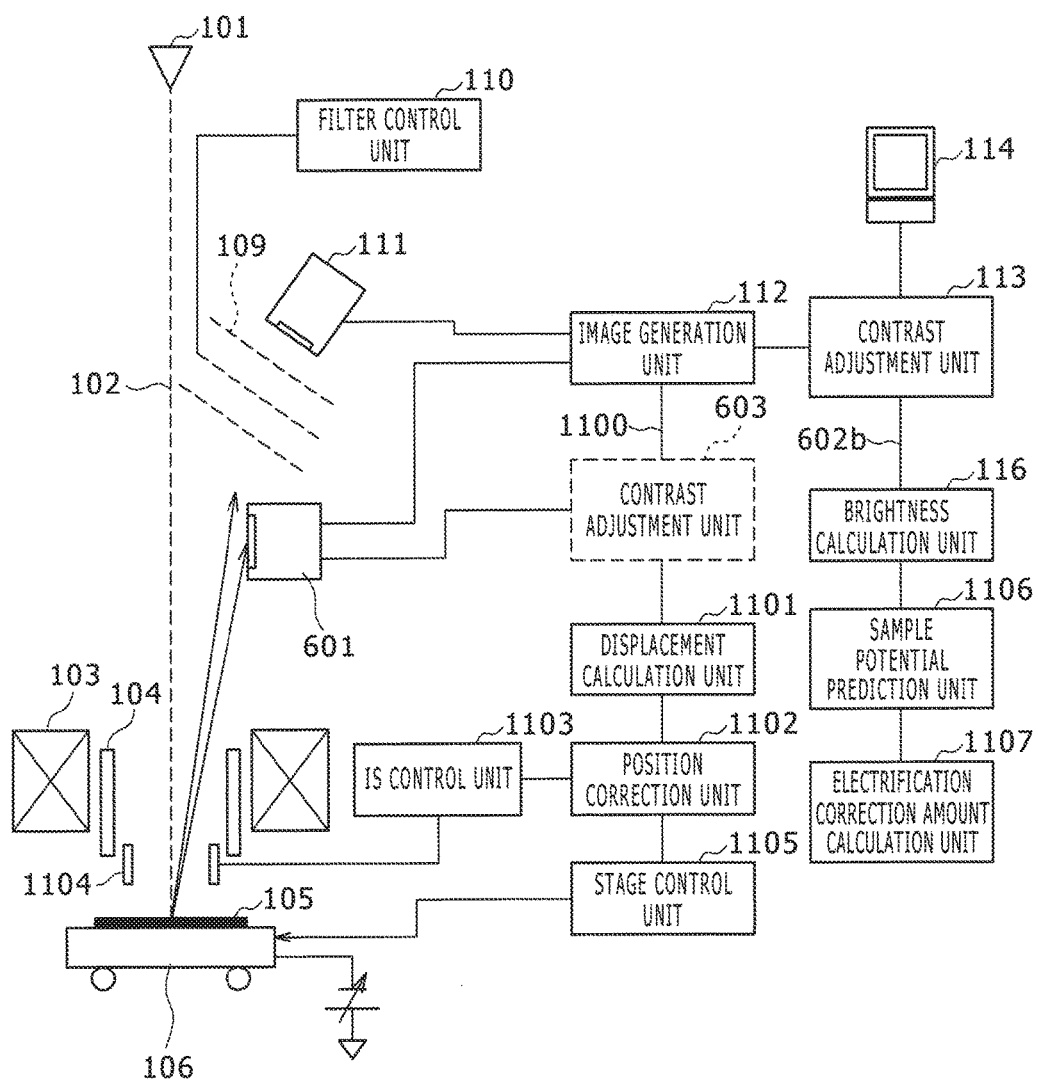
FIG. 11 is a diagram showing the general outline of a SEM-type length measuring device related to a sixth embodiment.

FIG. 11 shows the configuration of a SEM-type length measuring device related to a sixth embodiment. Components in FIG. 11 identical with those explained in the above embodiments are assigned the same reference symbols as in the above embodiments and repeated explanation thereof is omitted. This embodiment is characterized in that position correction as preprocessing is carried out before performing the focus correction and the reference adjustment of the energy filter and a correction amount is calculated from a sample potential change amount. The preprocessing makes it possible to realize accuracy improvement of the subsequent focus correction and energy filter reference adjustment and efficiency improvement of the adjustment.

In this embodiment, the detection system includes the detector 111 having the detected electron selection unit (the energy filter 109 in this example) and the detector 601 not having the detected electron selection unit. The image generation unit 112 generates a plurality of images in regard to one scan by using the detection signals acquired by the detectors 601 and 111.

The image generated from the detection signal of the detector 601 is sent to a displacement calculation unit 1101 via a path 1100. In this case, the displacement calculation unit 1101 calculates the displacement by using the image generated with the detector 601. Subsequently, a position correction unit 1102 outputs a correction command to an image shift control unit 1103 or a stage control unit 1105 based on the calculated displacement.

For example, when the displacement is less than a prescribed threshold value, the position correction unit 1102 may control an image shift coil 1104 via the image shift control unit 1103. Conversely, when the displacement is greater than the prescribed threshold value, the position correction unit 1102 may control the movable stage 106 via the stage control unit 1105.

Incidentally, the contrast adjustment unit 603 may be added between the image generation unit 112 and the displacement calculation unit 1101 as shown in FIG. 11. The contrast adjustment unit 603 is a unit for making contrast adjustment in regard to the image generated from the detection signal of the detector 601.

Meanwhile, the image generated from the detection signal of the detector 111 is sent to the brightness calculation unit 116 via the path 602b. In this case, the image generated from the detection signal of the detector 111 may be used by the contrast adjustment unit 113 for the contrast adjustment. Subsequently, the brightness calculation unit 116 calculates the brightness from the image. A sample potential prediction unit 1106 calculates the sample potential change amount from a predicted change amount of the brightness. Based on the change amount, an electrification correction amount calculation unit 1107 calculates a correction amount for making adjustment of an optical system parameter when the sample is electrified. For example, the electrification correction amount calculation unit 1107 may calculate a shift width of the adjustment of the energy characteristic curve S(Vs) based on the sample potential change amount.

Figure 12:
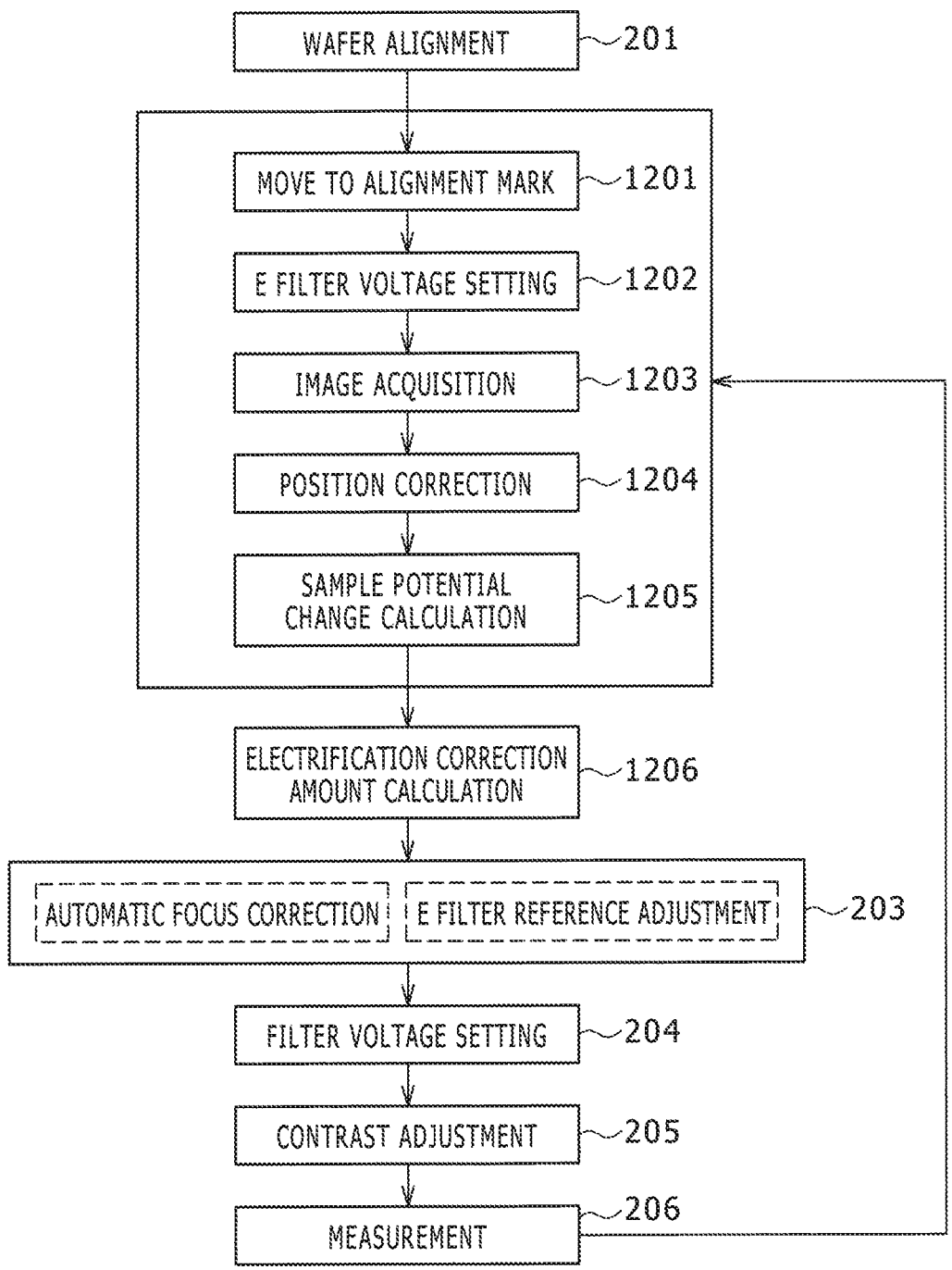
FIG. 12 is a flow chart showing a measurement method using the SEM-type length measuring device related to the sixth embodiment.

FIG. 12 is a flow chart of a measurement flow related to the sixth embodiment. Steps in FIG. 12 identical with those in FIG. 2 are assigned the same reference symbols as in FIG. 2 and repeated explanation thereof is omitted.

After the wafer alignment (201) is finished, the stage control unit 1105 moves the movable stage 106 to an alignment position in the vicinity of the measurement point (1201). During or after the movement of the movable stage 106, the filter control unit 110 sets the voltage of the energy filter 109 at a preset value (1202).

Subsequently, the image generation unit 112 generates a plurality of images from one scan (1203). Here, the plurality of images include an image acquired from the detection signal obtained by the detector 601 and an image acquired from the detection signal obtained by the detector 111.

Subsequently, by using the image generated from the detector of the detector 601 included in the plurality of images acquired in the step 1203, the displacement of the measurement point is corrected (1204) in the same way as in the normal flow of the measurement point positioning (the step 202 in FIG. 2). More specifically, the displacement calculation unit 1101 calculates the displacement by using the image generated from the detector of the detector 601. Subsequently, the position correction unit 1102 outputs the correction command to the image shift control unit 1103 or the stage control unit 1105 based on the calculated displacement.

For example, when the displacement is less than the prescribed threshold value, the position correction unit 1102 outputs a command to the image shift control unit 1103. The image shift control unit 1103 controls the image shift coil 1104 based on the received command. Conversely, when the displacement is greater than the prescribed threshold value, the position correction unit 1102 outputs a command to the stage control unit 1105. The stage control unit 1105 controls the movable stage 106 based on the received command.

Subsequently, the sample potential change is calculated from the image acquired by the detector 111 having the detected electron selection unit (1205). More specifically, the contrast adjustment unit 113 adjusts the contrast of the image acquired by the detector 111 and outputs the adjusted image to the brightness calculation unit 116. Subsequently, the brightness calculation unit 116 calculates the brightness from the image. Subsequently, the sample potential prediction unit 1106 calculates the sample potential change based on the calculated brightness.

Figure 13:
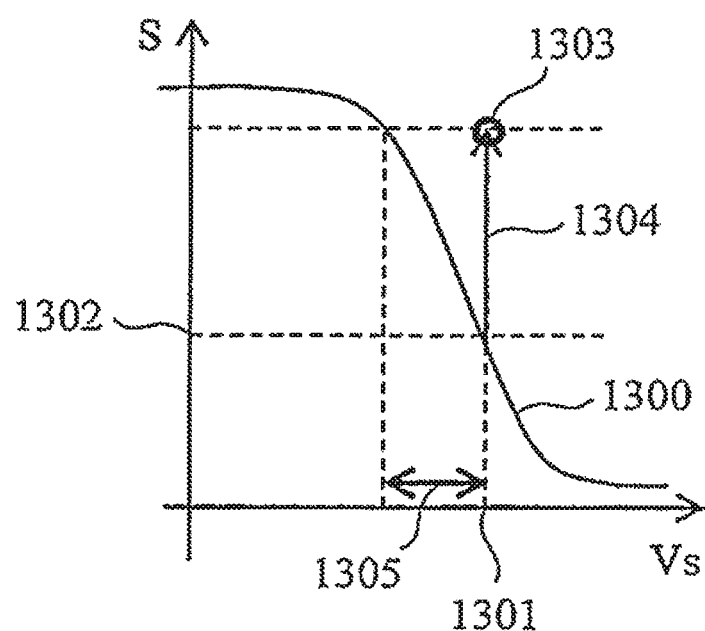
FIG. 13 is a diagram for explaining an example of calculation of a sample potential change by using the energy characteristic curve.

The algorithm of the sample potential change calculation by the sample potential prediction unit 1106 will be explained below. FIG. 13 is a diagram for explaining the energy characteristic curve, the obtained brightness and the predicted sample potential change. The energy characteristic curve S(Vs) 1300 has previously been registered in a prescribed storage unit of the control processing unit. Incidentally, this energy characteristic curve 1300 may be updated upon each measurement point based on the characteristic curve acquired at the time of the reference adjustment of the energy filter at the previous measurement point.

The sample potential prediction unit 1106 calculates the predicted sample potential change by using the energy characteristic curve 1300 and the brightness calculated by the brightness calculation unit 116. By using the energy characteristic curve 1300, the brightness difference 1304 between the brightness 1302 predicted from a preset voltage value 1301 of the energy filter 109 and the actually obtained brightness 1303 can be found. The sample potential change 1305 can be calculated by performing the inverse operation of the energy characteristic curve S(Vs) 1300 on the brightness difference. The sample potential prediction unit 1106 outputs the calculated sample potential change amount to the electrification correction amount calculation unit 1107.

By using the above-described algorithm of the sample potential change calculation, the prediction of the sample potential change becomes possible as long as at least one point of the brightness change with respect to the voltage of the energy filter 109 is found. In reality, in cases where some images are acquired at the time of the positioning flow, the prediction accuracy of the sample potential change can be increased by repeating the same operation a corresponding number of times.

Subsequently, the electrification correction amount calculation unit 1107 calculates the correction amount (feedback amount) for cases where the sample is electrified based on the sample potential change amount (1206). Especially, the electrification correction amount calculation unit 1107 may determine the shift width of the intensity in the focus correction and the reference adjustment of the energy filter described in the first embodiment based on the sample potential change amount. By optimizing the shift width, shortening the adjustment time becomes possible. The electrification correction amount calculation unit 1107 may also calculate a correction amount (feedback amount) of the optical system parameter for cases where the sample is electrified.

Incidentally, whether or not to perform the feedback by means of the electrification amount prediction can be set on the screen shown in FIG. 4. The screen of FIG. 4 may include a fifth setting part 409 for setting whether or not to perform the electrification prediction mode. The process of the electrification amount prediction in this embodiment can be carried out by setting the fifth setting part 409 to on.

Subsequently, the focus adjustment and the reference adjustment of the energy filter 109 are made (203). Subsequently, the filter voltage to be applied to the energy filter 109 is set based on the filter characteristic voltage specified by the user (204). Subsequently, contrast adjustment for adjusting the brightness and the contrast of the display image is carried out (205). Thereafter, the measurement at the measurement point is carried out (206). After the measurement (206), the process returns to the step 1201 and the measurement is repeated.

Seventh Embodiment

Figure 14:
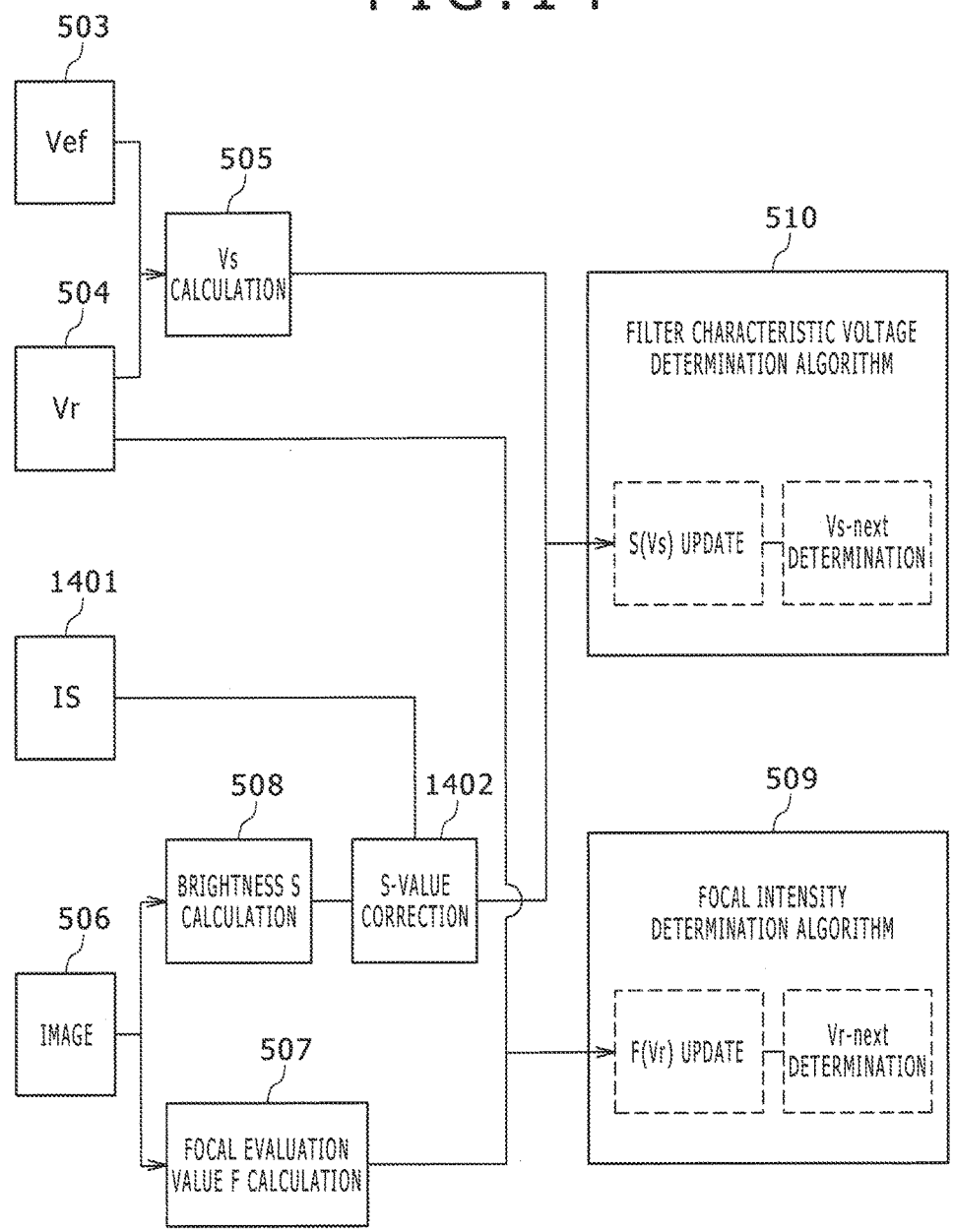
FIG. 14 is a diagram showing the general outline of inputs and outputs of a sequence related to a seventh embodiment.

FIG. 14 is a diagram showing the general outline of inputs and outputs of a sequence related to a seventh embodiment. Processes in FIG. 14 identical with those in FIG. 5B are assigned the same reference symbols as in FIG. 5B and repeated explanation thereof is omitted.

The image acquisition is carried out generally by use of the image shift adjusting the position of the electron beam. The incidence angle of electrons upon the detected electron selection unit (energy filter 109) changes depending on the amount of use of the image shift. Thus, there are cases where the filtering property of the energy filter 109 changes.

The brightness calculation unit 116 may correct the brightness according to the image shift amount (IS) 1401 used in the actual adjustment by using a previously prepared correction coefficient (1402). The filter characteristic voltage determination algorithm is performed by using the corrected brightness (510). The reference adjustment of the energy filter 109 is performed based on this procedure.

As above, it becomes possible to maintain high accuracy of the adjustment even in cases where the incidence angle upon the detected electron selection unit (energy filter 109) changes. This embodiment is not limited to the above-described example since the purpose of this embodiment is to correct for the change in the filtering property due to the change in the incidence angle upon the detected electron selection unit. For example, while the image shift coil is taken as an example of a factor causing the change of the incidence angle in this embodiment, the correction is possible by, for example, previously assigning a correction coefficient also to an amount such as the amount of use of another alignment coil affecting the position of detected electrons.

Further, while FIG. 14 shows an example of applying the correction according to the image shift amount to the example of FIG. 5B, the correction is applicable also to the example of FIG. 1B.

Eighth Embodiment

Figure 15:
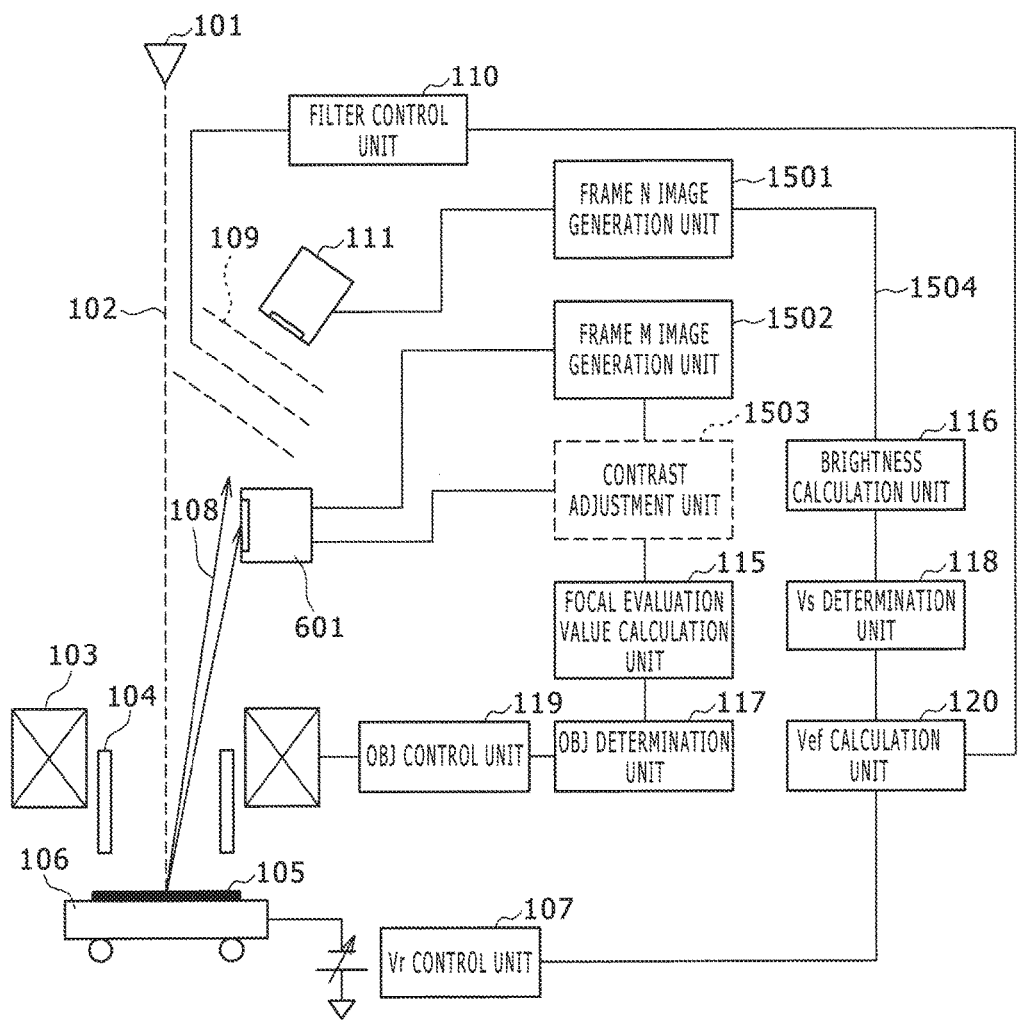
FIG. 15 is a diagram showing the general outline of a SEM-type length measuring device related to an eighth embodiment.

FIG. 15 shows the configuration of a SEM-type length measuring device related to an eighth embodiment. Components in FIG. 15 identical with those in FIG. 6 are assigned the same reference symbols as in FIG. 6 and repeated explanation thereof is omitted.

The detection system in this embodiment includes the detector 601 not having the detected electron selection unit and the detector 111 having the detected electron selection unit (the energy filter 109 in this example). Further, the control system includes a frame N image generation unit 1501, a frame M image generation unit 1502, a contrast adjustment unit 1503.

The frame N image generation unit 1501 generates an image of a frame N by using the detection signal from the detector 111. The frame M image generation unit 1502 generates an image of a frame M by using the detection signal from the detector 601.

The image for the focus adjustment generated in the frame M is sent to the focal evaluation value calculation unit 115. In this case, the image may undergo contrast adjustment by the contrast adjustment unit 1503. Meanwhile, the image for the energy filter reference potential calculation generated in the frame N is sent to the brightness calculation unit 116 via a path 1504. The subsequent processes are the equivalent to those in the first embodiment.

Figure 16:
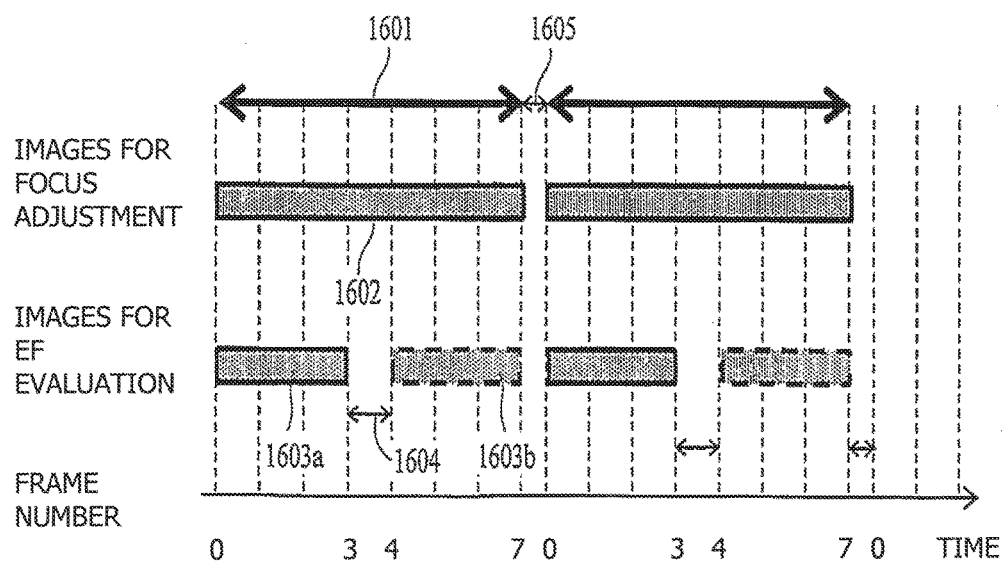
FIG. 16 is a diagram showing a time chart of image generation related to the eighth embodiment.

An adjustment method using this configuration will be explained below. FIG. 16 is a diagram showing a time chart of image generation. FIG. 16 shows a chart in a case where seven frames are selected as images for the focus adjustment and three frames are selected as images for the reference adjustment of the energy filter 109 when a scan command for seven frames is issued to the SEM-type length measuring device. In this embodiment, in regard to the images for the focus investigation, the image acquired from "one scan" means seven the frames of images. In regard to the images for the reference adjustment of the energy filter 109, the image acquired from "one scan" means the three frames of images.

In a scan time interval 1601, an image acquisition time for the focus adjustment is as indicated by the reference symbol 1602, while an image acquisition time for the energy filter adjustment is as indicated by the reference symbol 1603. In this case, the brightness calculation (203c), the filter characteristic voltage determination algorithm (203e) and the Vef calculation (203f) shown in FIG. 2 and the Vef output are carried out in a time 1604 of one frame after the first image acquisition 1603a for the energy filter adjustment. Here, in cases where the next image acquisition time for the energy filter adjustment can be started before the end of the scan time interval 1601, the next image acquisition 1603b is carried out in sync with a trigger signal starting the next frame. Therefore, in the period of calculating one focal evaluation value and making the focus adjustment, the adjustment of the reference intensity of the energy filter 109 is made multiple times, and it becomes possible to make the focus adjustment with the brightness of the time when the reference intensity has been changed.

The time 1605 till the next scan is determined by the time from the calculation of the focal evaluation value and the brightness (203c) to the resetting of the focus adjustment intensity value to be applied next and Vef (203a) as explained in the first embodiment.

According to this embodiment, adjustment with high time efficiency becomes possible even when the number of frames of the images for the focus adjustment and the number of frames of the images for the reference adjustment of the energy filter 109 are set separately. Especially, it becomes possible to increase the number of points of the adjustment having the smaller number of frames (the focus adjustment or the reference adjustment). The object of this embodiment is to increase the efficiency in cases where the two adjustments are assigned different numbers of frames, and thus specific conditions in this embodiment such as the numerical values of the numbers of frames are not limited to the above example.

According to the embodiments described above, it is possible to change the intensity of the detected electron selection means each time the intensity of the focus adjustment is changed, extract two parameters, the focal evaluation value and the brightness, from the image acquired from one scan, and perform the two adjustments at the same time. Therefore, shortening the adjustment time becomes possible. Further, it becomes possible to make various types of observations by use of a high resolution energy filter in a stable manner. Furthermore, the electrification amount of the sample can be predicted by having an index value of the sample potential. By calibrating the magnification and the position of the primary electron beam based on the electrification amount, accuracy improvement of the magnification and the positioning of the device can also be expected.

In regard to the embodiments described above, the flow order of the measurement method, the device configuration, the numerical values, etc. are just an example and are not to be limited to this example.

The present invention is not restricted to the embodiments described above but contains a variety of modifications. The above-described embodiments, which have been described in detail for clear and easy explanation of the present invention, are not necessarily limited to those including all the components described above. It is possible to replace part of the configuration of an embodiment with a configuration in another embodiment or to add a configuration in an embodiment to a configuration in another embodiment. It is also possible to make an addition/deletion/replacement of a configuration in regard to part of the configuration of each embodiment.

The above-described embodiments are for the purpose of efficiently making the focus correction and the reference adjustment of the detected electron selection unit based on an image acquired from one scan, and thus a variety of modifications can be made to the embodiments. For example, while electron beam length measuring devices are described as examples in the above embodiments, the embodiments are applicable also to other types of charged particle beam devices including a detected electron selection unit and a focus adjustment unit. Further, while the detected electron selection unit is implemented by the energy filter having mesh-type electrodes, a spectrometer or magnetic sector functioning as a bandpass filter may also be used as the detected electron selection unit. While the focal intensity determination algorithm and the filter characteristic voltage determination algorithm are described to be performed in series, the algorithms may also be performed in the reverse order or in parallel processing.

The processes described above can also be implemented by a program code of software implementing the functions of the processes. In this case, a storage medium in which the program code has been recorded is supplied to a system or device, and a computer (or a CPU or MPU) of the system or device reads out the program code stored in the storage medium. In this case, the program code itself, read out from the storage medium, implements the functions of the above-described embodiments, and the program code itself and the storage medium storing the program code constitute a part of the present invention. Storage media usable for supplying such a program code include, for example, flexible disk, CD-ROM, DVD-ROM, hard disk, optical disk, magneto-optical disk, CD-R, magnetic tape, nonvolatile memory card, ROM, etc.

The processes and technologies described herein are essentially not related to any particular device and are implementable by any suitable combination of components. Further, various types of general-purpose devices are usable. There are also cases where constructing a special-purpose device is beneficial for executing the steps of the methods described herein. That is, part or all of the above-described processes may be implemented by hardware using electronic components such as integrated circuits, for example.

Further, in the above-described embodiments, only some of control lines and information lines considered to be necessary for the explanation are shown; not all of the control lines and the information lines are necessarily shown in regard to the product. There can be cases where all the components are interconnected.

DESCRIPTION OF REFERENCE SYMBOLS

101: Electron source
102: Primary electron beam
103: Objective lens
104: Deflector
105: Sample
106: Movable stage
107: Retarding control unit
108: Electron generated in sample
109: Energy filter
110: Filter control unit
111: Detector
112: Image generation unit
113: Contrast adjustment unit
114: Display unit
115: Focal evaluation value calculation unit
116: Brightness calculation unit
117: Objective lens determination unit
118: Filter characteristic voltage determination unit
119: Objective lens control unit
120: Filter voltage calculation unit
501: Retarding voltage determination unit
601: Detector not having detected electron selection unit
603: Contrast adjustment unit
901: Reference potential storage unit
902: Current monitor unit
903: Dose amount monitor unit
904: Surface potential prediction unit
1101: Displacement calculation unit
1102: Position correction unit
1103: Image shift control unit
1104: Image shift coil
1105: Stage control unit
1106: Sample potential prediction unit
1107: Electrification correction amount calculation unit
1501: Frame N image generation unit
1502: Frame M image generation unit
1503: Contrast adjustment unit

The invention claimed is:

1. A charged particle beam device comprising:
a charged particle source that generates a charged particle beam;
a focus adjustment unit that adjusts a focal position of the charged particle beam;
a deflection unit configured to scan the charged particle beam on a sample;
a detection unit that detects charged particles generated when the sample is irradiated with the charged particle beam;
a detected charged particle selection unit that selects charged particles to be detected by the detection unit; and
a control processing unit comprising a filter control unit operably coupled to and which controls the detected charged particle selection unit,
wherein the control processing unit is configured to perform focus adjustment of the focus adjustment unit, and is configured to perform reference adjustment of the detected charged particle selection unit by calculating and outputting a reference voltage to the filter control unit, based on information received from the detection unit acquired from one scan.

2. The charged particle beam device according to claim 1, wherein the control processing unit is configured to:
calculate a focal evaluation value and brightness from an image generated based on the information from the detection unit,
calculate intensity of the focus adjustment unit by using the focal evaluation value, and
calculate reference intensity of the detected charged particle selection unit by using the brightness.

3. The charged particle beam device according to claim 2, wherein:
the focus adjustment unit is an objective lens, and
the control processing unit calculates intensity of the objective lens from relationship between the intensity of the objective lens and the focal evaluation value.

4. The charged particle beam device according to claim 2, wherein the control processing unit calculates the reference intensity of the detected charged particle selection unit from relationship between the intensity of the detected charged particle selection unit and the brightness.

5. The charged particle beam device according to claim 2, wherein:
the focus adjustment unit is a retarding voltage control unit that applies retarding voltage to the sample, and
the control processing unit calculates the reference intensity of the detected charged particle selection unit from relationship among the intensity of the detected charged particle selection unit, intensity of the retarding voltage and the brightness.

6. The charged particle beam device according to claim 5, wherein the control processing unit is configured to:
calculate the intensity of the retarding voltage from relationship between the retarding voltage and the focal evaluation value, and
calculate the reference intensity of the detected charged particle selection unit by using the calculated intensity of the retarding voltage.

7. The charged particle beam device according to claim 2, wherein the control processing unit is configured to:
correct relationship between the intensity of the detected charged particle selection unit and the brightness by using a correction formula obtained from relationship between a change in the intensity of the focus adjustment unit and a change in the brightness, and
calculate the reference intensity of the detected charged particle selection unit from the corrected relationship between the intensity of the detected charged particle selection unit and the brightness.

8. The charged particle beam device according to claim 7, wherein:
the detection unit includes a first detector having the detected charged particle selection unit and a second detector not having the detected charged particle selection unit, and
the control processing unit updates the correction formula by calculating the brightness and the focal evaluation value from an image generated based on information from the second detector.

9. The charged particle beam device according to claim 2, further comprising:
a monitor unit that monitors an electric current amount of the charged particle beam;
a dose amount monitor unit that calculates a dose amount from the electric current amount and the number of times of the scan; and
a surface potential prediction unit that predicts a change in sample electrification potential with respect to the dose amount based on a deviation in the reference intensity with respect to the dose amount.

10. The charged particle beam device according to claim 2, wherein the control processing unit corrects the brightness according to an image shift amount for adjustment of a position of the charged particle beam.

11. The charged particle beam device according to claim 1, wherein:
   the detection unit includes a first detector having the detected charged particle selection unit and a second detector not having the detected charged particle selection unit, and
   the control processing unit generates a first image, generated based on information from the first detector, and a second image, generated based on information from the second detector, from the one scan.

12. The charged particle beam device according to claim 11, wherein the control processing unit is configured to:
   calculate brightness from the first image,
   calculate a focal evaluation value from the second image,
   calculate intensity of the focus adjustment unit by using the focal evaluation value, and
   calculate reference intensity of the detected charged particle selection unit by using the brightness.

13. The charged particle beam device according to claim 11, wherein the control processing unit is configured to:
   calculate brightness from the first image,
   calculate a displacement from the second image,
   perform image shift control or stage control based on the displacement, and
   calculate a sample potential change amount based on relationship between intensity of the detected charged particle selection unit and the brightness.

14. The charged particle beam device according to claim 11, wherein the number of frames of the first image and the number of frames of the second image differ from each other.

15. The charged particle beam device according to claim 14, wherein:
   the number of frames of the second image is greater than the number of frames of the first image, and
   the control processing unit makes the reference adjustment of the detected charged particle selection unit while one focus adjustment is made.

* * * * *